United States Patent
Tran et al.

(10) Patent No.: US 11,568,229 B2
(45) Date of Patent: Jan. 31, 2023

(54) REDUNDANT MEMORY ACCESS FOR ROWS OR COLUMNS CONTAINING FAULTY MEMORY CELLS IN ANALOG NEURAL MEMORY IN DEEP LEARNING ARTIFICIAL NEURAL NETWORK

(71) Applicant: Silicon Storage Technology, Inc., San Jose, CA (US)

(72) Inventors: Hieu Van Tran, San Jose, CA (US); Stanley Hong, San Jose, CA (US); Thuan Vu, San Jose, CA (US); Anh Ly, San Jose, CA (US); Hien Pham, Ho Chi Minh (VN); Kha Nguyen, Ho Chi Minh (VN); Han Tran, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 1156 days.

(21) Appl. No.: 16/151,259

(22) Filed: Oct. 3, 2018

(65) Prior Publication Data
US 2020/0019849 A1    Jan. 16, 2020

Related U.S. Application Data

(60) Provisional application No. 62/696,778, filed on Jul. 11, 2018.

(51) Int. Cl.
G06N 3/06 (2006.01)
G06F 3/06 (2006.01)
G06F 11/16 (2006.01)
G06N 3/063 (2006.01)

(52) U.S. Cl.
CPC ......... *G06N 3/0635* (2013.01); *G06F 3/0619* (2013.01); *G06F 3/0635* (2013.01); *G06F 3/0688* (2013.01); *G06F 11/1666* (2013.01)

(58) Field of Classification Search
CPC ... G06N 3/0635; G06F 3/0619; G06F 3/0635; G06F 3/0688; G06F 11/1666
See application file for complete search history.

(56) References Cited

U.S. PATENT DOCUMENTS

| | | | |
|---|---|---|---|
| 5,729,152 A | 3/1998 | Leung | |
| 6,747,310 B2 | 6/2004 | Fan | |
| 7,643,354 B2* | 1/2010 | Landfield | G06N 3/049 365/189.05 |
| 7,911,872 B2* | 3/2011 | Lakhani | G11C 29/76 365/233.5 |
| 8,971,124 B1* | 3/2015 | Manning | G06F 3/0625 365/205 |
| 2006/0198209 A1 | 9/2006 | Tran | |

(Continued)

FOREIGN PATENT DOCUMENTS

TW    201742075 A    12/2017
WO    2017/200888 A1    11/2017

*Primary Examiner* — Justin R Knapp
(74) *Attorney, Agent, or Firm* — DLA Piper LLP US

(57) ABSTRACT

Numerous embodiments are disclosed for accessing redundant non-volatile memory cells in place of one or more rows or columns containing one or more faulty non-volatile memory cells during a program, erase, read, or neural read operation in an analog neural memory system used in a deep learning artificial neural network.

31 Claims, 33 Drawing Sheets

(56) References Cited

U.S. PATENT DOCUMENTS

| | | | |
|---|---|---|---|
| 2008/0137446 A1* | 6/2008 | Kohara | G11C 29/44 365/201 |
| 2011/0176377 A1 | 7/2011 | Koyama | |
| 2017/0337466 A1 | 11/2017 | Bayat et al. | |

* cited by examiner

FIGURE 11

|  | WL | WL-unsel | BL | BL-unsel | SL | SL-unsel |
|---|---|---|---|---|---|---|
| Read | 1-3.5V | -0.5V/0V | 0.6-2V (Ineuron) | 0.6V-2V/0V | 0V | 0V |
| Erase | ~5-13V | 0V | 0V | 0V | 0V | 0V |
| Program | 1-2V | -0.5V/0V | 0.1-3 uA | Vinh ~2.5V | 4-10V | 0-1V/FLT |

FIGURE 13

| | WL | WL-unsel | BL | BL-unsel | SL | SL-unsel |
|---|---|---|---|---|---|---|
| Read | 1-3.5V | -0.5V/0V | 0.6-2V | 0.6V-2V/0V | ~0.3-1V (Ineuron) | 0V |
| Erase | ~5-13V | 0V | 0V | 0V | 0V | SL-inhibit (~4-8V) |
| Program | 1-2V | -0.5V/0V | 0.1-3 uA | Vinh ~2.5V | 4-10V | 0-1V/FLT |

FIGURE 15

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | 0-2.6V | 0-2.6V | 5-12V | 0-2.6V | 0V | 0V |
| Program | 0.7-1V | -0.5V/0V | 0.1-1uA | Vinh (1-2V) | 4-11V | 0-2.6V | 0-2.6V | 4.5-5V | 0-2.6V | 4.5-5V | 0-1V |

FIGURE 17

| | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2V | -0.5V/0V | 0.6-2V (Ineuron) | 0V | 0-2.6V | 0-2.6V | 0-2.6V | 0-2.6V | 0-2.6V | 0V | 0V |
| Erase | 0V | 0V | 0V | 0V | 0V | CGINH (4-9V) | 0-2.6V | 5-12V | 0-2.6V | 0V | 0V |
| Program | 0.7-1V | -0.5V/0V | 0.1-1uA | Vinh (1-2V) | 4-11V | 0-2.6V | 0-2.6V | 4.5-5V | 0-2.6V | 4.5-5V | 0-1V |

REDUNDANT MEMORY ACCESS FOR ROWS OR COLUMNS CONTAINING FAULTY MEMORY CELLS IN ANALOG NEURAL MEMORY IN DEEP LEARNING ARTIFICIAL NEURAL NETWORK

PRIORITY CLAIM

This application claims priority to U.S. Provisional Patent Application No. 62/696,778, filed on Jul. 11, 2018, and titled, "Redundant Memory Access for Rows or Columns Containing Faulty Memory Cells in Analog Neuro Memory in Deep Learning Artificial Neural Network," which is incorporated by reference herein.

FIELD OF THE INVENTION

Numerous embodiments are disclosed for accessing redundant non-volatile memory cells in place of one or more rows or columns containing one or more faulty non-volatile memory cells during a program, erase, read, or neural read operation in an analog neural memory system used in a deep learning artificial neural network.

BACKGROUND OF THE INVENTION

Artificial neural networks mimic biological neural networks (e.g., the central nervous systems of animals, in particular the brain) which are used to estimate or approximate functions that can depend on a large number of inputs and are generally unknown. Artificial neural networks generally include layers of interconnected "neurons" which exchange messages between each other.

FIG. 1 illustrates an artificial neural network 100, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge in the floating gate. For example, each floating gate must hold one of N different values, where N is the number of different weights that can be indicated by each cell. Examples of N include 16, 32, and 64.

One unique characteristic of analog neuromorphic memory systems is that the system must support two different types of read operations. In a normal read operation, an individual memory cell is read as in conventional memory systems. However, in a neural read operation, the entire array of memory cells is read at one time, where each bit line will output a current that is the sum of all currents from the memory cells connected to that bit line.

Supporting both types of read operations leads to several challenges. One challenge is how to provide redundancy for the system. Where multiple redundant rows or columns are being used (due to the occurrence of multiple faulty rows or columns), the system must be able to activate all of the redundant rows or columns at one time during a neural read operation. However, in conventional systems, a read or program operation will operate on only one row or a sector of rows at any given time—and not all of them—and therefore only some of the redundant rows or columns will need to be asserted at any given time. Thus, prior art decoding systems do not support a neural read operation.

What is needed is an improved decoding system to be used with analog neuromorphic memory to provide redundancy during programming, erase, read, and neural read operations.

SUMMARY OF THE INVENTION

Numerous embodiments are disclosed for accessing redundant non-volatile memory cells in place of one or more rows or columns containing one or more faulty non-volatile memory cells during a program, erase, read, or neural read operation in an analog neural memory system used in a deep learning artificial neural network.

BRIEF DESCRIPTION OF THE DRAWINGS

FIG. 11 depicts operating voltages to perform operations on the vector multiplier matrix of FIG. 10.

FIG. 13 depicts operating voltages to perform operations on the vector multiplier matrix of FIG. 12.

FIG. 15 depicts operating voltages to perform operations on the vector multiplier matrix of FIG. 14.

FIG. 17 depicts operating voltages to perform operations on the vector multiplier matrix of FIG. 16.

DETAILED DESCRIPTION OF THE INVENTION

The artificial neural networks of the present invention utilize a combination of CMOS technology and non-volatile memory arrays.

Non-Volatile Memory Cells

Figure 1:
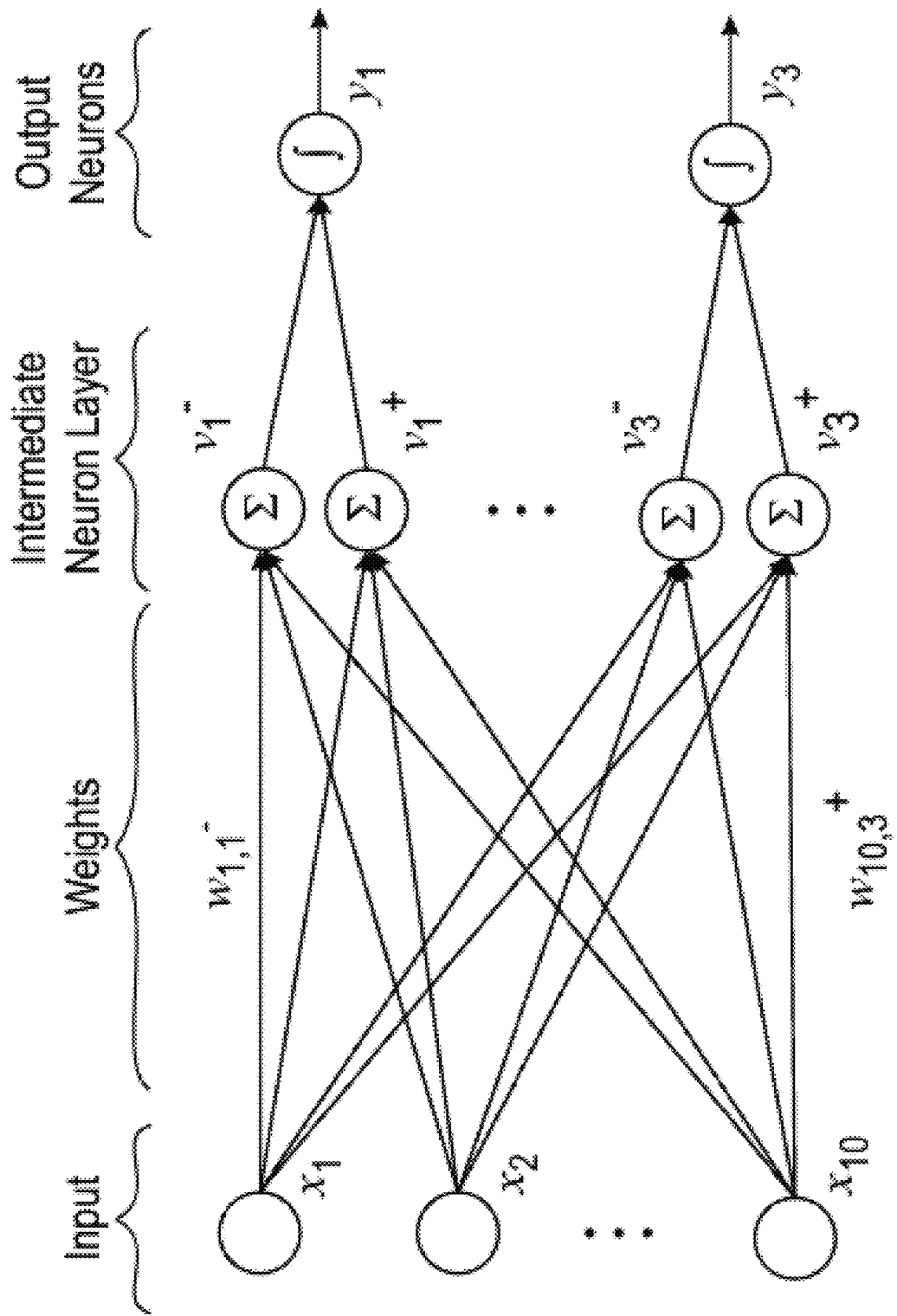
FIG. 1 is a diagram that illustrates a prior art artificial neural network.
Figure 2:
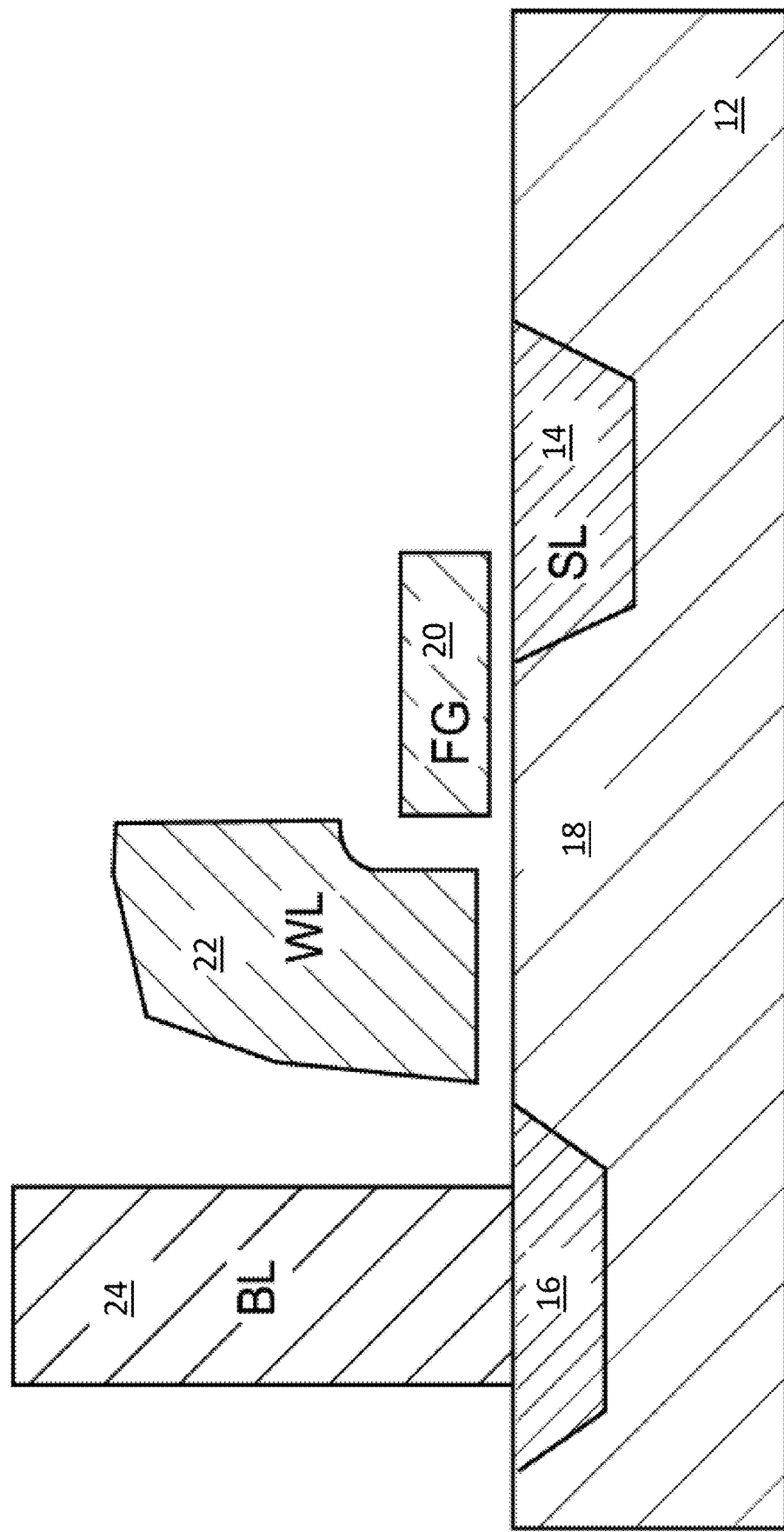
FIG. 2 is a cross-sectional side view of a conventional 2-gate non-volatile memory cell.

Digital non-volatile memories are well known. For example, U.S. Pat. No. 5,029,130 ("the '130 patent") discloses an array of split gate non-volatile memory cells, and is incorporated herein by reference for all purposes. Such a memory cell is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 16. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source 16. Electron current will flow from the source 16 towards the drain 14. The electrons will accelerate and become heated when they reach the gap between the word line terminal 22 and the floating gate 20. Some of the heated electrons will be injected through the gate oxide 26 onto the floating gate 20 due to the attractive electrostatic force from the floating gate 20.

Memory cell 210 is read by placing positive read voltages on the drain 14 and word line terminal 22 (which turns on the channel region under the word line terminal). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 210 for performing read, erase, and program operations:

TABLE NO. 1

Operation of Flash Memory Cell 210 of FIG. 2

|  | WL | BL | SL |
| --- | --- | --- | --- |
| Read | 2-3 V | 0.6-2 V | 0 V |
| Erase | ~11-13 V | 0 V | 0 V |
| Program | 1-2 V | 1-3 µA | 9-10 V |

Figure 3:
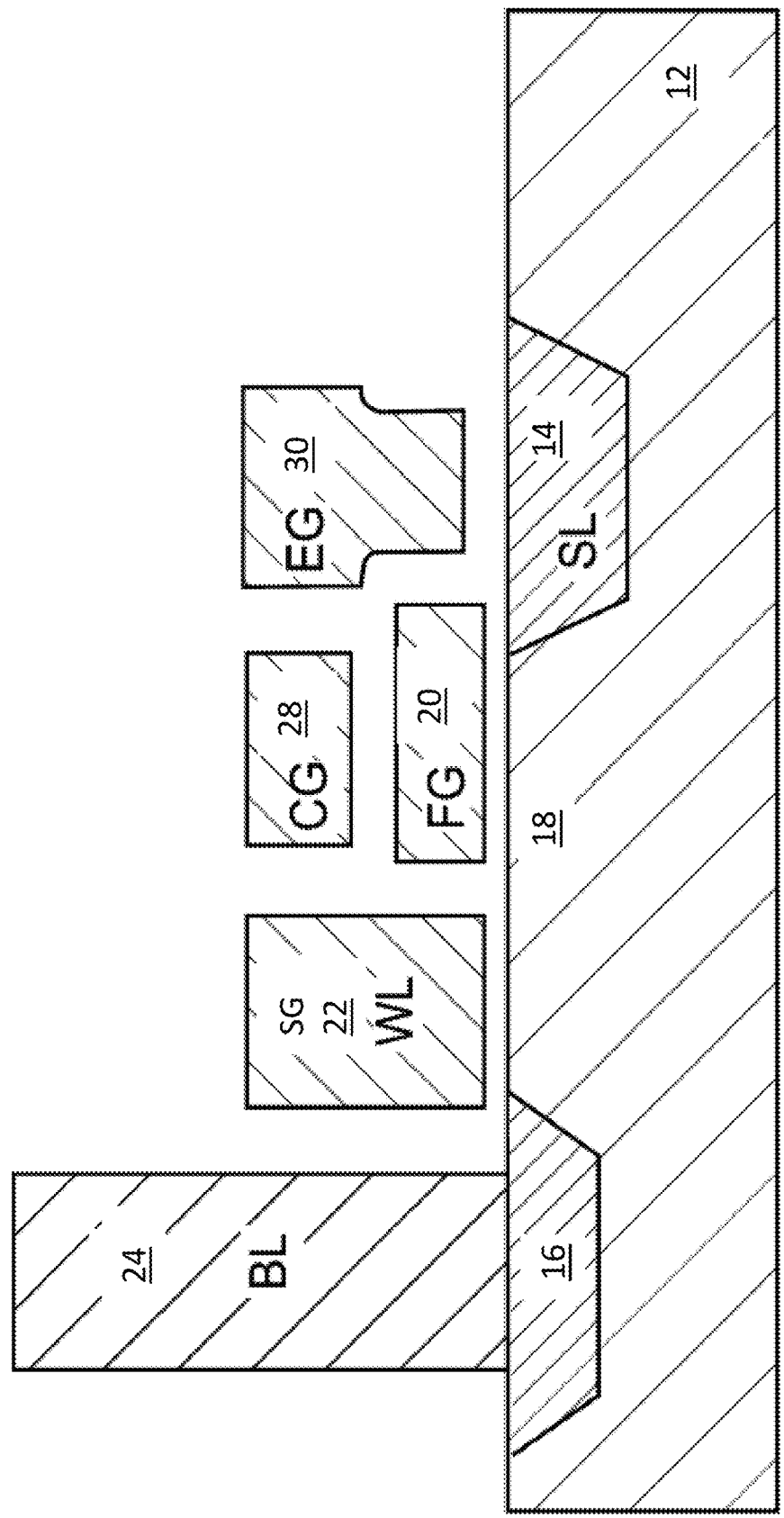
FIG. 3 is a cross-sectional side view of a conventional 4-gate non-volatile memory cell.

Other split gate memory cell configurations are known. For example, FIG. 3 depicts four-gate memory cell 310 comprising source region 14, drain region 16, floating gate 20 over a first portion of channel region 18, a select gate 28 (typically coupled to a word line) over a second portion of the channel region 18, a control gate 22 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is shown by heated electrons from the channel region 18 injecting themselves onto the floating gate 20. Erasing is shown by electrons tunneling from the floating gate 20 to the erase gate 30.

Table No. 2 depicts typical voltage ranges that can be applied to the terminals of memory cell 310 for performing read, erase, and program operations:

TABLE NO. 2

| Operation of Flash Memory Cell 310 of FIG. 3 | | | | | |
|---|---|---|---|---|---|
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 4:
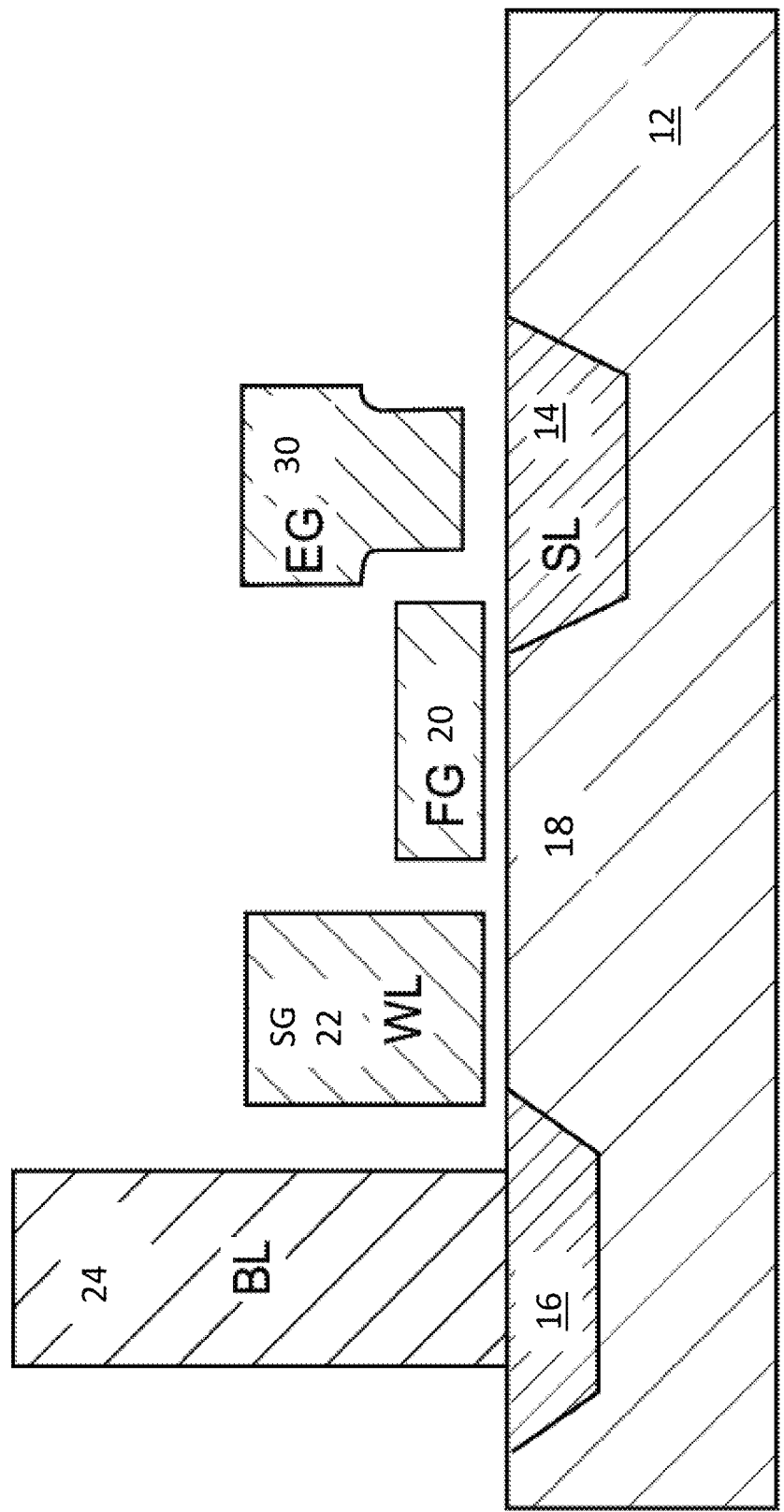
FIG. 4 is a side cross-sectional side view of conventional 3-gate non-volatile memory cell.

FIG. 4 depicts split gate three-gate memory cell 410. Memory cell 410 is identical to the memory cell 310 of FIG. 3 except that memory cell 410 does not have a separate control gate. The erase operation (erasing through erase gate) and read operation are similar to that of the FIG. 3 except there is no control gate bias. The programming operation also is done without the control gate bias, hence the program voltage on the source line is higher to compensate for lack of control gate bias.

Table No. 3 depicts typical voltage ranges that can be applied to the terminals of memory cell 410 for performing read, erase, and program operations:

TABLE NO. 3

| Operation of Flash Memory Cell 410 of FIG. 4 | | | | |
|---|---|---|---|---|
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 5:
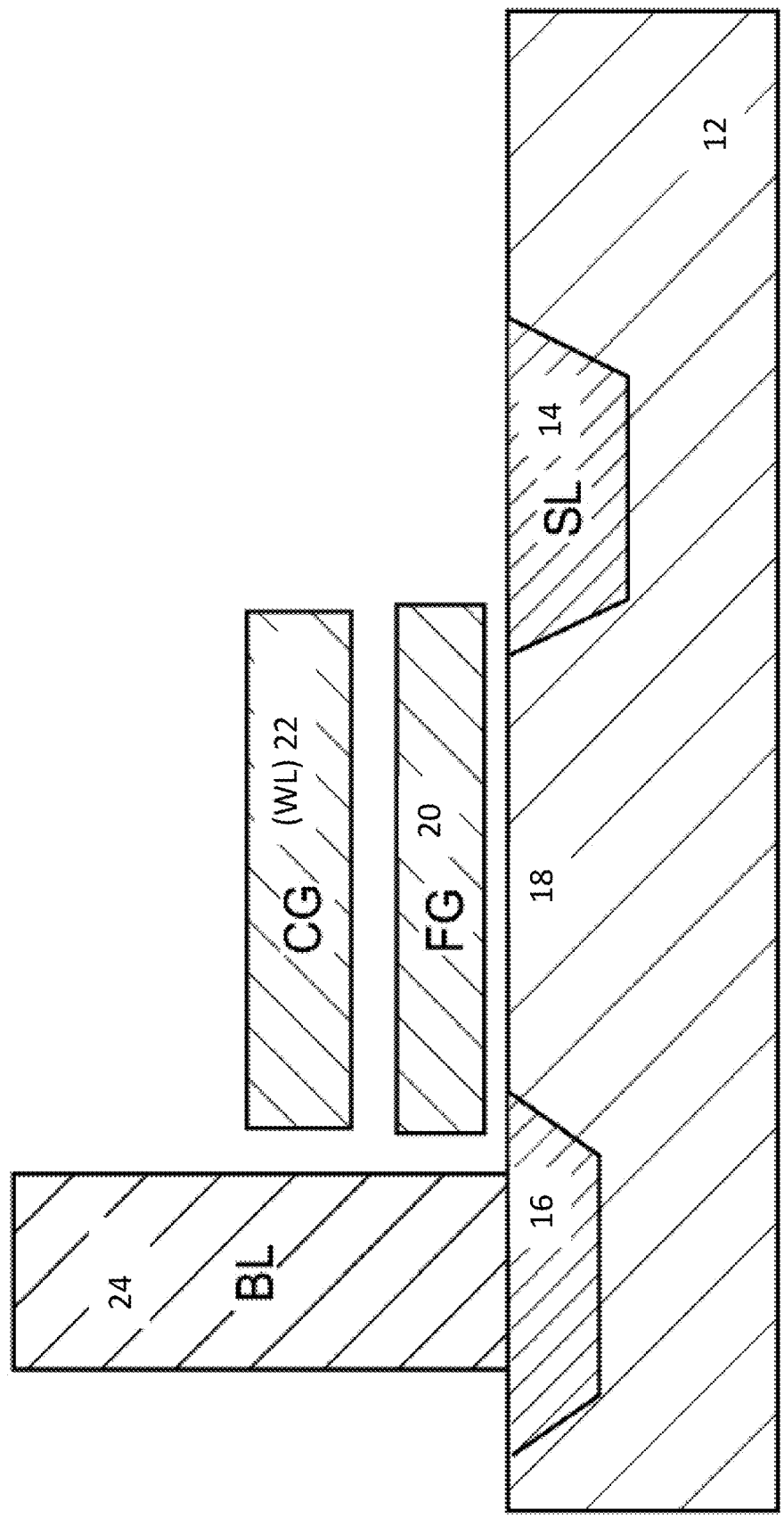
FIG. 5 is a cross-sectional side view of another conventional 2-gate non-volatile memory cell.

FIG. 5 depicts stacked gate memory cell 510. Memory cell 510 is similar to memory cell 210 of FIG. 2, except floating gate 20 extends over the entire channel region 18, and control gate 22 extends over floating gate 20, separated by an insulating layer. The erase, programming, and read operations operate in a similar manner to that described previously for memory cell 210.

Table No. 4 depicts typical voltage ranges that can be applied to the terminals of memory cell 510 for performing read, erase, and program operations:

TABLE NO. 4

| Operation of Flash Memory Cell 510 of FIG. 5 | | | | |
|---|---|---|---|---|
| | CG | BL | SL | P-sub |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cells in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
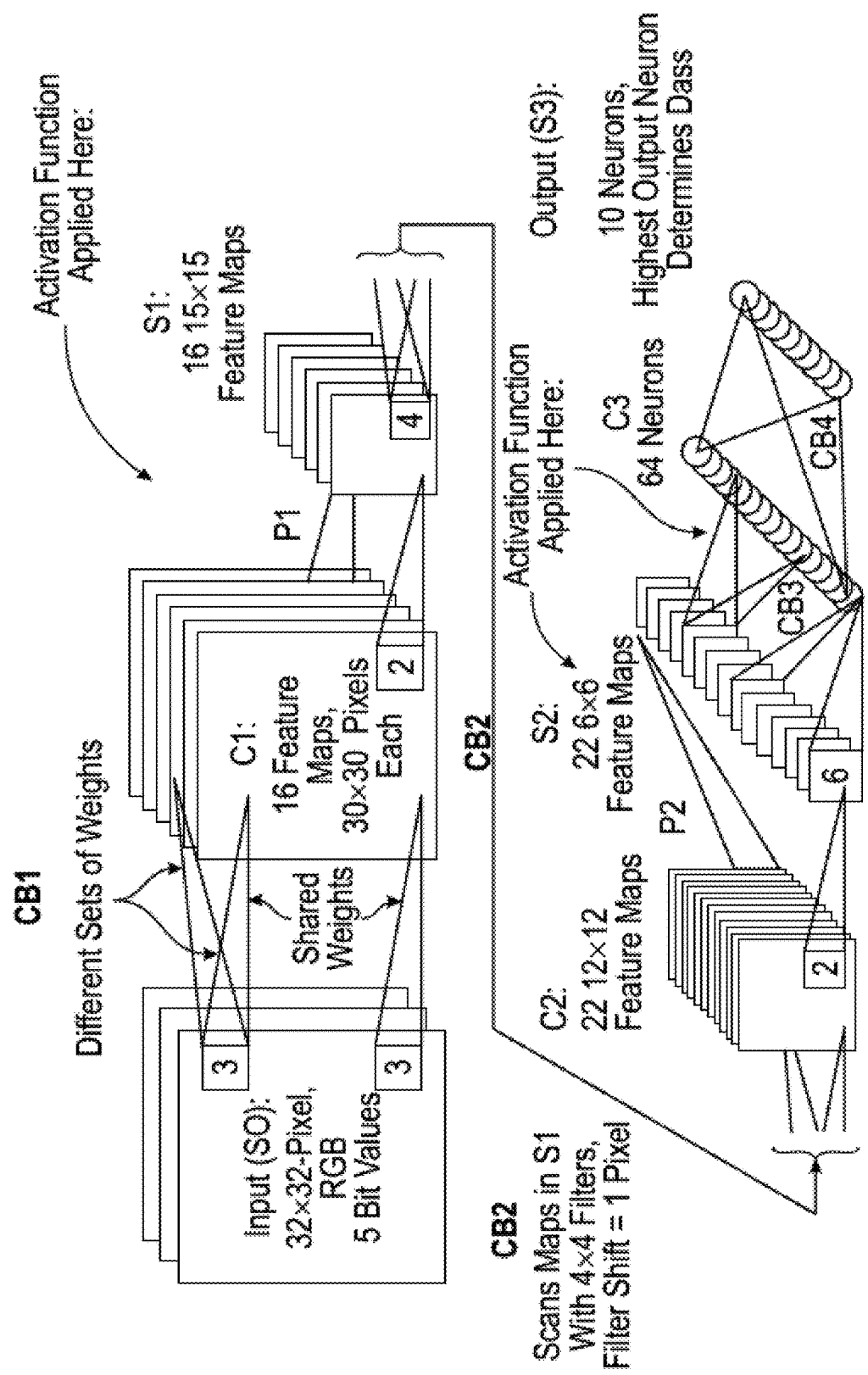
FIG. 6 is a diagram illustrating the different levels of an exemplary artificial neural network utilizing a non-volatile memory array.

FIG. 6 conceptually illustrates a non-limiting example of a neural network utilizing a non-volatile memory array. This example uses the non-volatile memory array neural net for a facial recognition application, but any other appropriate application could be implemented using a non-volatile memory array based neural network.

S0 is the input, which for this example is a 32×32 pixel RGB image with 5 bit precision (i.e. three 32×32 pixel arrays, one for each color R, G and B, each pixel being 5 bit precision). The synapses CB1 going from S0 to C1 have both different sets of weights and shared weights, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, whereby these 9 input values are multiplied by the appropriate weights and, after summing the outputs of that multiplication, a single output value is determined and provided by a first neuron of CB1 for generating a pixel of one of the layers of feature map C1. The 3×3 filter is then shifted one pixel to the right (i.e., adding the column of three pixels on the right, and dropping the column of three pixels on the left), whereby the 9 pixel values in this newly positioned filter are provided to the synapses CB1, whereby they are multiplied by the same weights and a second single output value is determined by the associated neuron. This process is continued until the 3×3 filter scans across the entire 32×32 pixel image, for all three colors and for all bits (precision values). The process is then repeated using different sets of weights to generate a different feature map of C1, until all the features maps of layer C1 have been calculated.

At C1, in the present example, there are 16 feature maps, with 30×30 pixels each. Each pixel is a new feature pixel extracted from multiplying the inputs and kernel, and therefore each feature map is a two dimensional array, and thus in this example the synapses CB1 constitutes 16 layers of two dimensional arrays (keeping in mind that the neuron layers and arrays referenced herein are logical relationships, not necessarily physical relationships—i.e., the arrays are not necessarily oriented in physical two dimensional arrays). Each of the 16 feature maps is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from C1 to S1, which pools values from consecutive, non-overlapping 2×2 regions in each feature map. The purpose of the pooling stage is to average out the nearby location (or a max function can also be used), to reduce the dependence of the edge location for example and to reduce the data size before going to the next stage. At S1, there are 16 15×15 feature maps (i.e., sixteen different arrays of 15×15 pixels each). The synapses and associated neurons in CB2 going from S1 to C2 scan maps in S1 with 4×4 filters, with a filter shift of 1 pixel. At C2, there are 22 12×12 feature maps. An activation function P2 (pooling) is applied before going from C2 to S2, which pools values from consecutive non-overlapping 2×2 regions in each feature map. At S2, there are 22 6×6 feature maps. An activation function is applied at the synapses CB3 going from S2 to C3, where every neuron in C3 connects to every map in S2. At C3, there are 64 neurons. The synapses CB4 going from C3 to the output S3 fully connects S3 to C3. The output at S3 includes 10 neurons, where the highest output neuron determines the class. This output could, for example, be indicative of an identification or classification of the contents of the original image.

Figure 7:
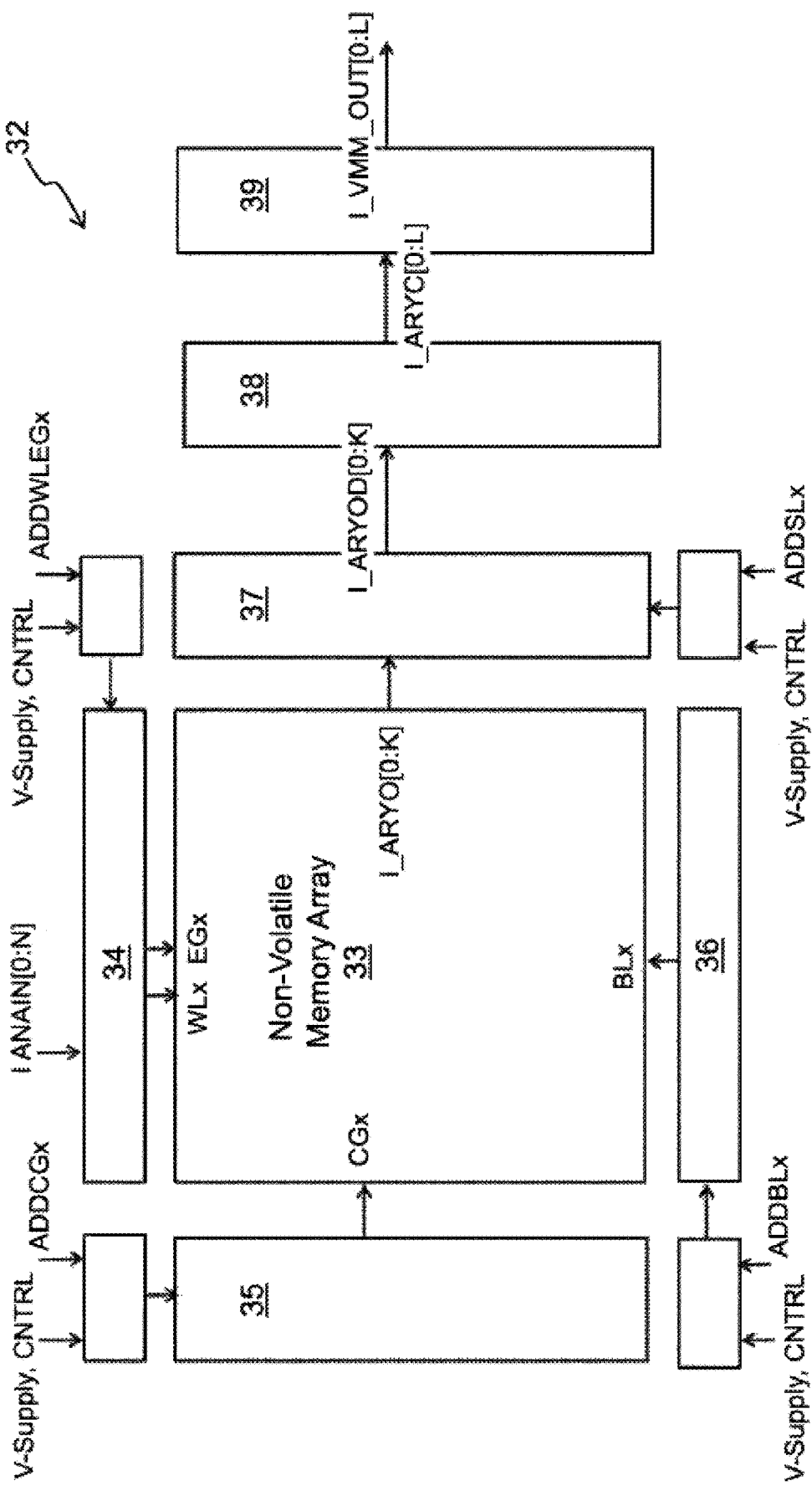
FIG. 7 is a block diagram illustrating a vector multiplier matrix.

Each level of synapses is implemented using an array, or a portion of an array, of non-volatile memory cells. FIG. 7 is a block diagram of the vector-by-matrix multiplication (VMM) array that includes the non-volatile memory cells, and is utilized as the synapses between an input layer and the next layer. Specifically, the VMM 32 includes an array of non-volatile memory cells 33, erase gate and word line gate decoder 34, control gate decoder 35, bit line decoder 36 and source line decoder 37, which decode the inputs for the memory array 33. Source line decoder 37 in this example also decodes the output of the memory cell array. Alternatively, bit line decoder 36 can decode the output of the memory array. The memory array serves two purposes. First, it stores the weights that will be used by the VMM. Second, the memory array effectively multiplies the inputs by the weights stored in the memory array and adds them up per output line (source line or bit line) to produce the output, which will be the input to the next layer or input to the final layer. By performing the multiplication and addition function, the memory array negates the need for separate multiplication and addition logic circuits and is also power efficient due to in-situ memory computation.

The output of the memory array is supplied to a differential summer (such as summing op-amp or summing current mirror) 38, which sums up the outputs of the memory cell array to create a single value for that convolution. The differential summer is such as to realize summation of positive weight and negative weight with positive input. The summed up output values are then supplied to the activation function circuit 39, which rectifies the output. The activation function may include sigmoid, tanh, or ReLU functions. The rectified output values become an element of a feature map as the next layer (C1 in the description above for example), and are then applied to the next synapse to produce next feature map layer or final layer. Therefore, in this example, the memory array constitutes a plurality of synapses (which receive their inputs from the prior layer of neurons or from an input layer such as an image database), and summing op-amp 38 and activation function circuit 39 constitute a plurality of neurons.

Figure 8:
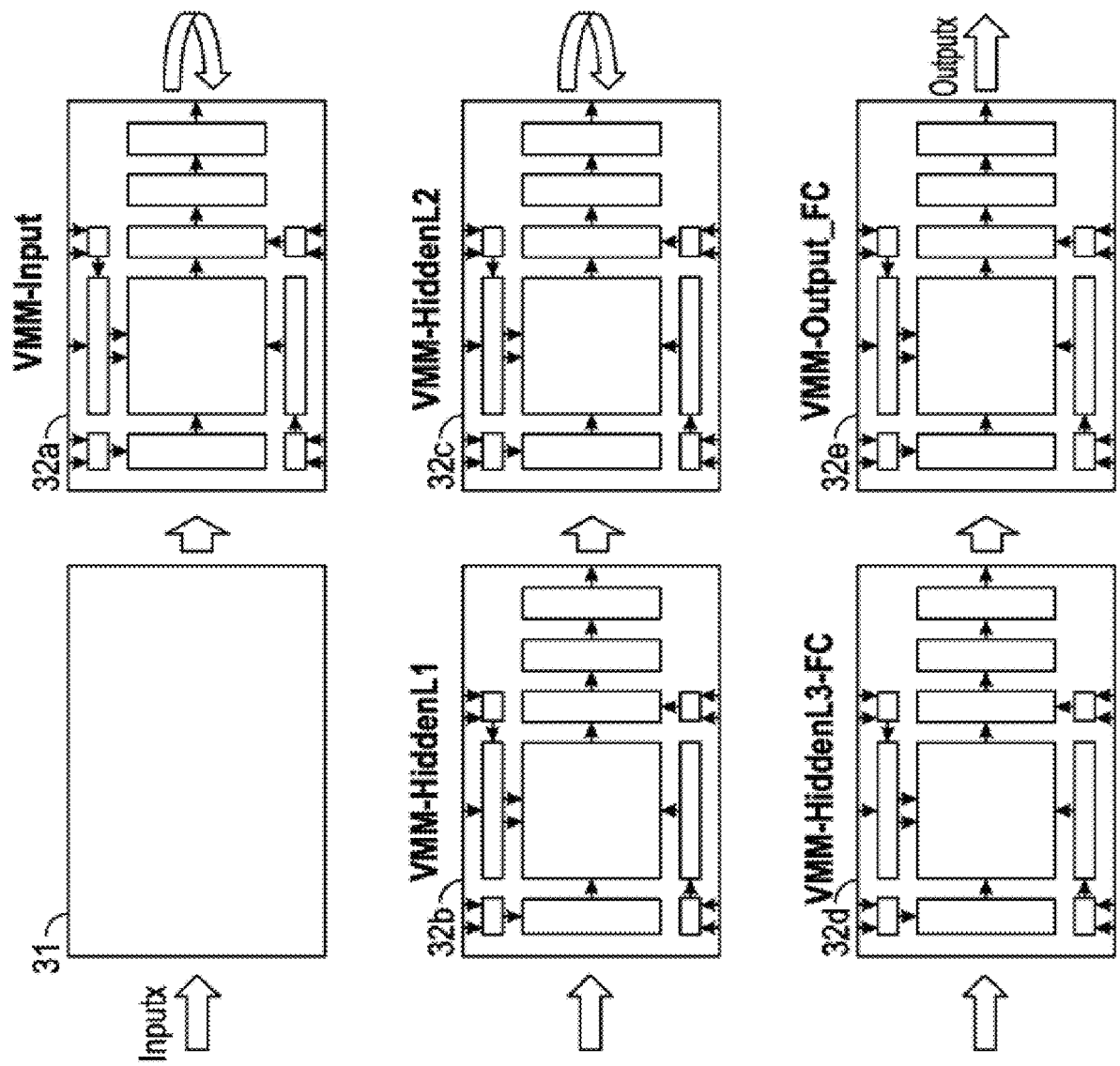
FIG. 8 is a block diagram illustrating various levels of a vector multiplier matrix.

FIG. 8 is a block diagram of the various levels of VMM. As shown in FIG. 8, the input is converted from digital to analog by digital-to-analog converter 31, and provided to input VMM 32a. The converted analog inputs could be voltage or current. The input D/A conversion for the first layer could be done by using a function or a LUT (look up table) that maps the inputs to appropriate analog levels for the matrix multiplier. The input conversion could also be done by an A/A Converter to convert an external analog input to a mapped analog input to the VMM. The output generated by the input VMM 32a is provided as an input to the next VMM (hidden level 1) 32b, which in turn generates an output that is provided as an input to the next VMM (hidden level 2) 32b, and so on. The various layers of VMM's 32 function as different layers of synapses and neurons of a convolutional neural network (CNN). Each VMM can be a stand-alone non-volatile memory array, or multiple VMMs could utilize different portions of the same non-volatile memory array, or multiple VMMs could utilize overlapping portions of the same non-volatile memory array. The example shown in FIG. 8 contains five layers (32a,32b, 32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-by-Matrix Multiplication (VMM) Arrays

Figure 9:
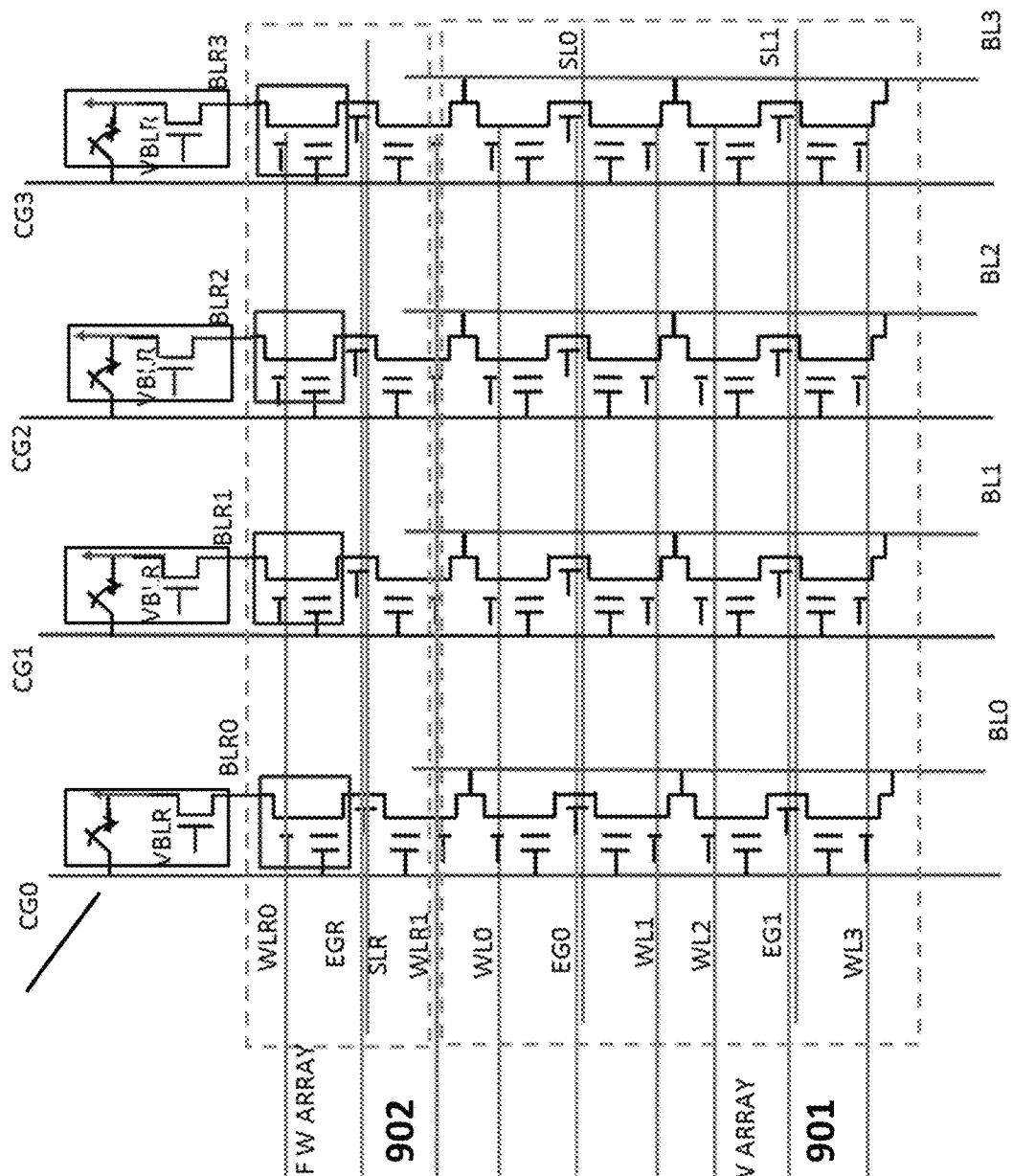
FIG. 9 depicts another embodiment of a vector multiplier matrix.

FIG. 9 depicts neuron VMM 900, which is particularly suited for memory cells of the type shown in FIG. 3, and is utilized as the synapses and parts of neurons between an input layer and the next layer. VMM 900 comprises a memory array 901 of non-volatile memory cells and reference array 902 (at the top of the array). Alternatively, another reference array can be placed at the bottom. In VMM 900, control gates line such as control gate line 903 run in a vertical direction (hence reference array 902 in the row direction, orthogonal to the input control gate lines), and erase gate lines such as erase gate line 904 run in a horizontal direction. Here, the inputs are provided on the control gate lines, and the output emerges on the source lines. In one embodiment only even rows are used, and in another embodiment, only odd rows are used. The current placed on the source line performs a summing function of all the currents from the memory cells connected to the source line.

As described herein for neural networks, the flash cells are preferably configured to operate in sub-threshold region.

The memory cells described herein are biased in weak inversion:

$$Ids = Io * e^{(Vg-Vth)/kVt} = w * Io * e^{(Vg)/kVt}$$

$$w = e^{(-Vth)/kVt}$$

For an I-to-V log converter using a memory cell to convert input current into an input voltage:

$$Vg = k * Vt * \log[Ids/wp * Io]$$

For a memory array used as a vector matrix multiplier VMM, the output current is:

$$Iout = wa * Io * e^{(Vg)/kVt}, \text{ namely}$$

$$Iout = (wa/wp) * Iin = W * Iin$$

$$W = e^{(Vthp-Vtha)/kVt}$$

A wordline or control gate can be used as the input for the memory cell for the input voltage.

Alternatively, the flash memory cells can be configured to operate in the linear region:

$$Ids = \text{beta} * (Vgs - Vth) * Vds; \text{beta} = u * Cox * W/L$$

$$W\alpha(Vgs - Vth)$$

For an I-to-V linear converter, a memory cell operating in the linear region can be used to convert linearly an input/output current into an input/output voltage.

Other embodiments for the ESF vector matrix multiplier are as described in U.S. patent application Ser. No. 15/826,345, which is incorporated by reference herein. A sourceline or a bitline can be used as the neuron output (current summation output).

Figure 10:
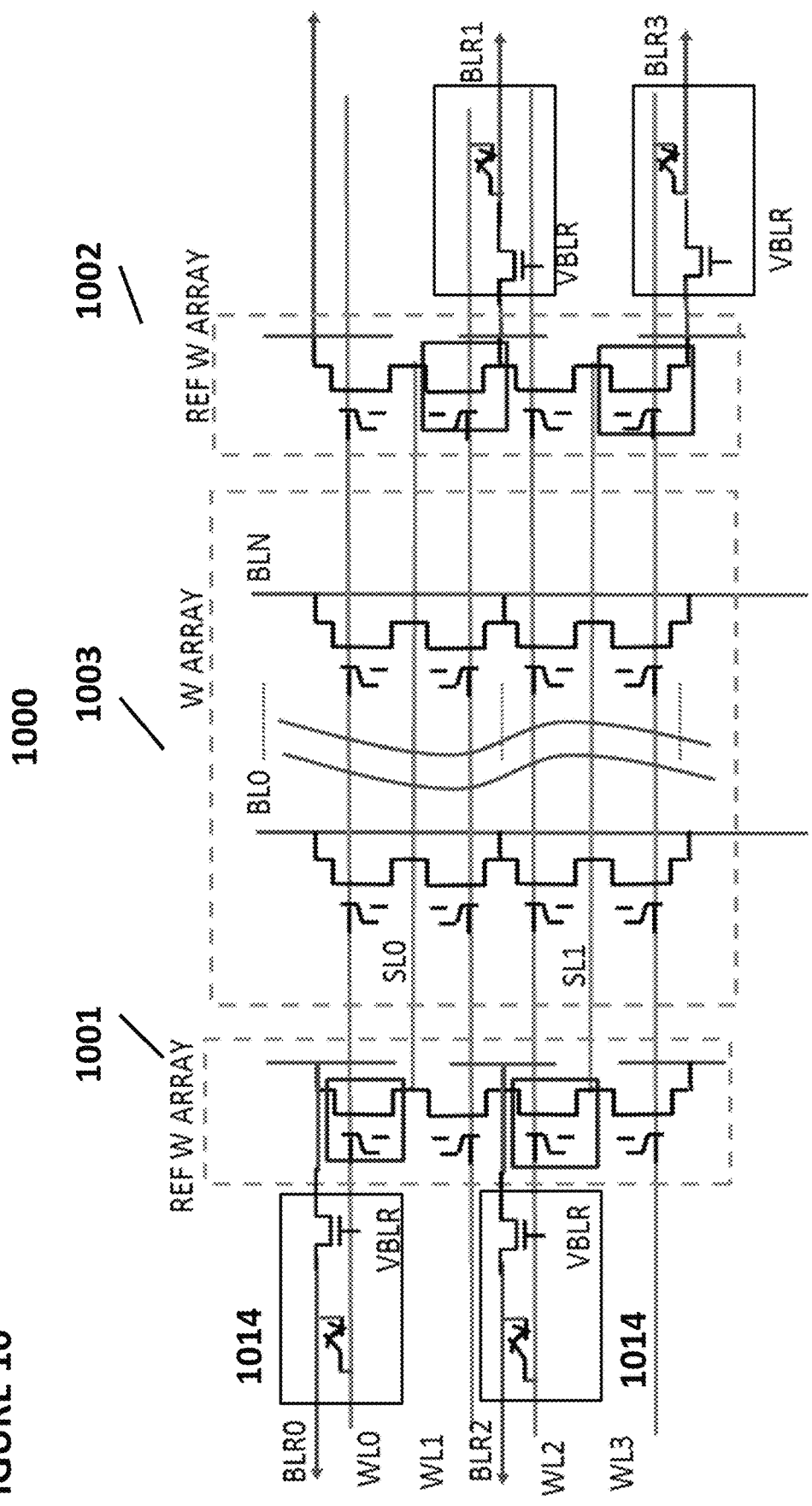
FIG. 10 depicts another embodiment of a vector multiplier matrix.

FIG. 10 depicts neuron VMM 1000, which is particularly suited for memory cells of the type shown in FIG. 2, and is utilized as the synapses between an input layer and the next layer. VMM 1000 comprises a memory array 1003 of non-volatile memory cells, reference array 1001, and reference array 1002. Reference arrays 1001 and 1002, in column direction of the array, serve to convert current inputs flowing into terminals BLR0-3 into voltage inputs WL0-3. In effect, the reference memory cells are diode connected through multiplexors with current inputs flowing into them. The reference cells are tuned (e.g., programmed) to target reference levels. The target reference levels are provided by a reference mini-array matrix. Memory array 1003 serves two purposes. First, it stores the weights that will be used by the VMM 1000. Second, memory array 1003 effectively multiplies the inputs (current inputs provided in terminals BLR0-3; reference arrays 1001 and 1002 convert these current inputs into the input voltages to supply to wordlines WL0-3) by the weights stored in the memory array and then add all the results (memory cell currents) to produce the output, which will be the input to the next layer or input to the final layer. By performing the multiplication and addition function, the memory array negates the need for separate multiplication and addition logic circuits and is also power efficient. Here, the voltage inputs are provided on the word lines, and the output emerges on the bit line during a read (inference) operation. The current placed on the bit line performs a summing function of all the currents from the memory cells connected to the bitline.

FIG. 11 depicts operating voltages for VMM 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 12:
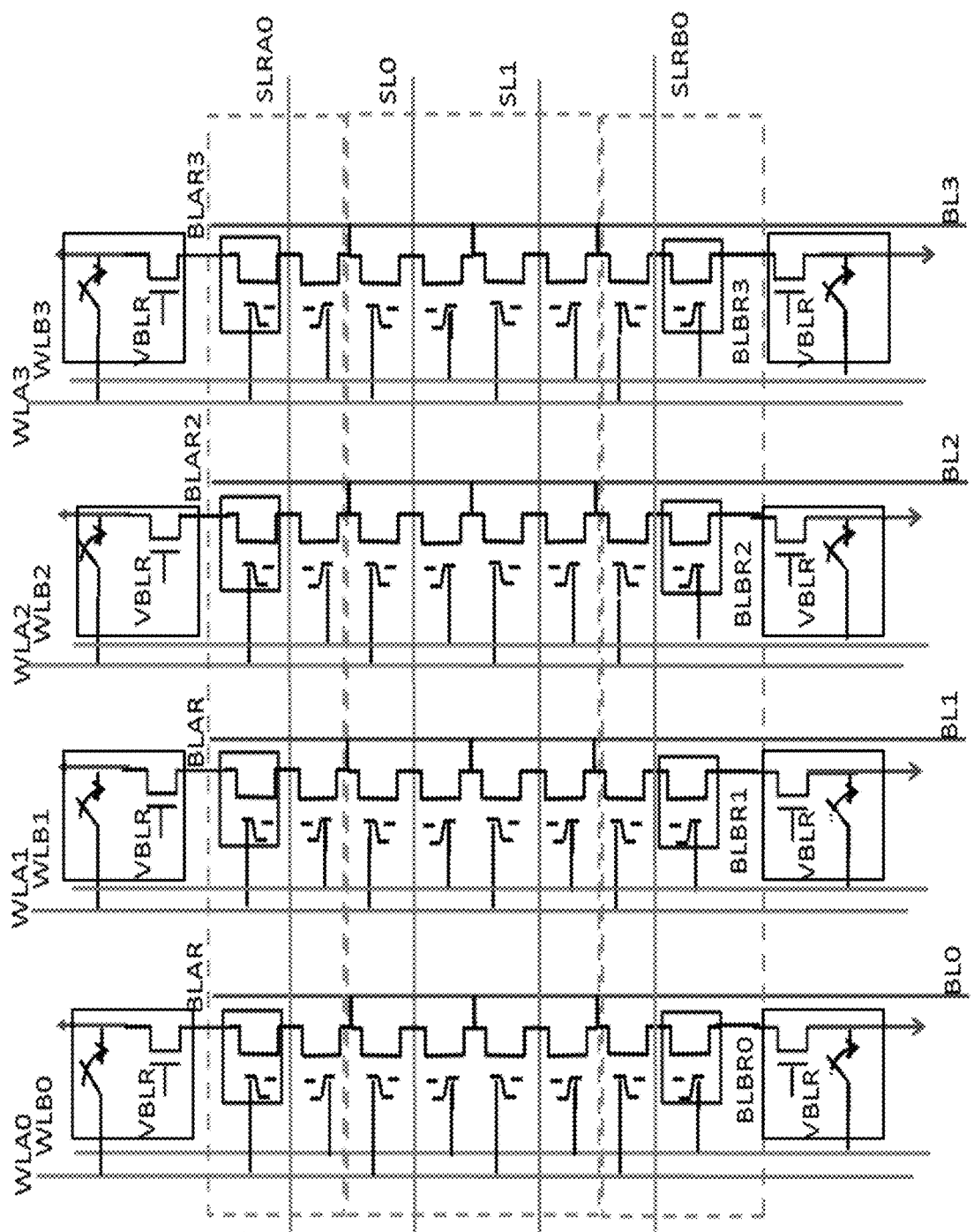
FIG. 12 depicts another embodiment of a vector multiplier matrix.

FIG. 12 depicts neuron VMM 1200, which is particularly suited for memory cells of the type shown in FIG. 2, and is utilized as the synapses and parts of neurons between an input layer and the next layer. VMM 1200 comprises a memory array 1203 of non-volatile memory cells, reference array 1201, and reference array 1202. The reference array 1201 and 1202 run in row direction of the array VMM 1200 is similar to VMM 1000 except that in VMM 1200 the word lines run in the vertical direction. Here, the inputs are provided on the word lines, and the output emerges on the source line during a read operation. The current placed on the source line performs a summing function of all the currents from the memory cells connected to the source line.

FIG. 13 depicts operating voltages for VMM 1200. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

Figure 14:
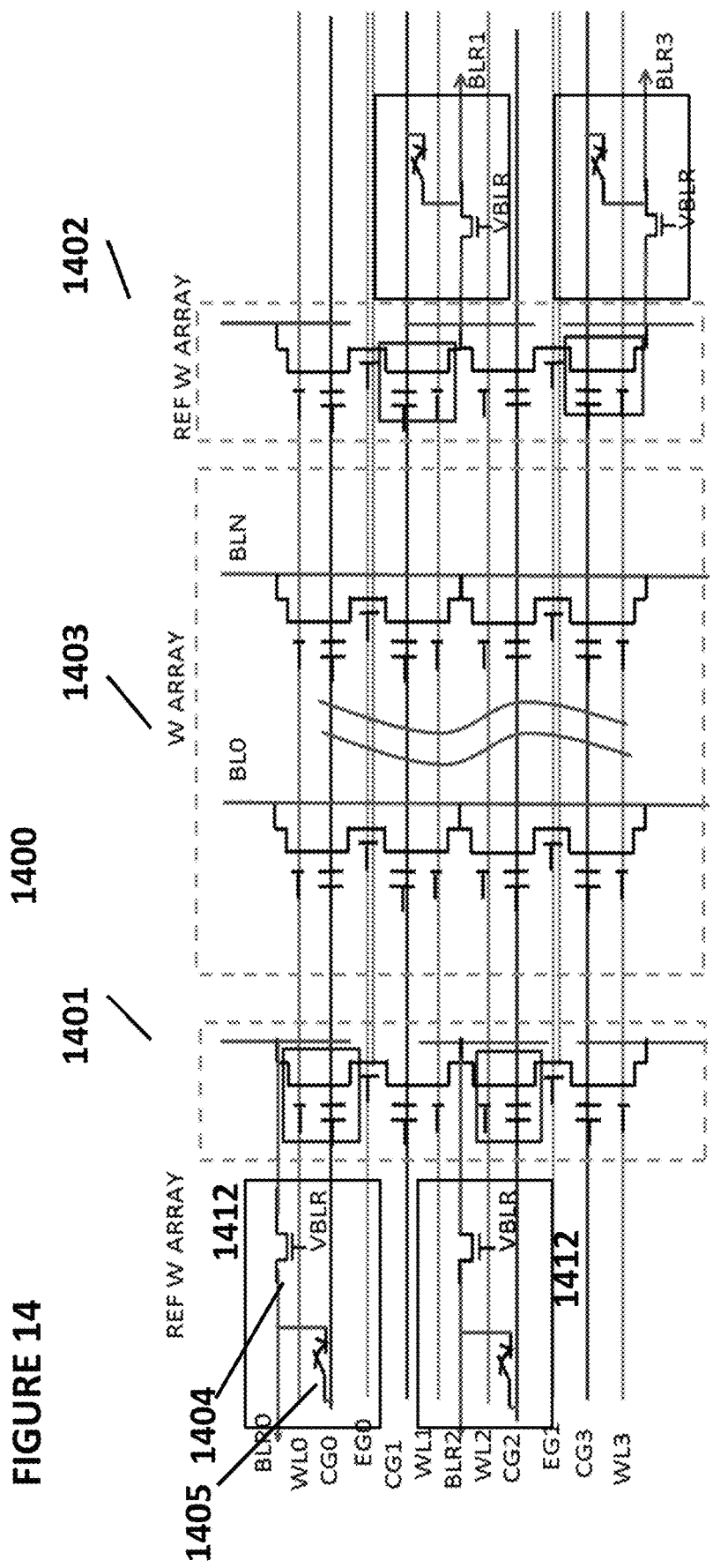
FIG. 14 depicts another embodiment of a vector multiplier matrix.

FIG. 14 depicts neuron VMM 1400, which is particularly suited for memory cells of the type shown in FIG. 3, and is utilized as the synapses and parts of neurons between an input layer and the next layer. VMM 1400 comprises a memory array 1403 of non-volatile memory cells, reference array 1401, and reference array 1402. The reference array 1401 and 1402 serves to convert current inputs flowing into terminals BLR0-3 into voltage inputs CG0-3. In effect, the reference memory cells are diode connected through cascoding mulitplexors 1414 with current inputs flowing into them. The mux 1414 includes a mux 1405 and a cascoding transistor 1404 to ensure a constant voltage on bitline of reference cells in read. The reference cells are tuned to target reference levels. Memory array 1403 serves two purposes. First, it stores the weights that will be used by the VMM 1400. Second, memory array 1403 effectively multiplies the inputs (current inputs provided to terminals BLR0-3; reference arrays 1401 and 1402 convert these current inputs into the input voltages to supply to the control gates CG0-3) by the weights stored in the memory array and then add all the results (cell currents) to produce the output, which will be the input to the next layer or input to the final layer. By performing the multiplication and addition function, the memory array negates the need for separate multiplication and addition logic circuits and is also power efficient. Here, the inputs are provided on the word lines, and the output emerges on the bitline during a read operation. The current placed on the bitline performs a summing function of all the currents from the memory cells connected to the bitline.

VMM 1400 implements uni-directional tuning for memory cells in memory array 1403. That is, each cell is erased and then partially programmed until the desired charge on the floating gate is reached. If too much charge is placed on the floating gate (such that the wrong value is stored in the cell), the cell must be erased and the sequence of partial programming operations must start over. As shown, two rows sharing the same erase gate need to be erased together (to be known as a page erase), and thereafter, each cell is partially programmed until the desired charge on the floating gate is reached, FIG. 15 depicts operating voltages for VMM 1400. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 16:
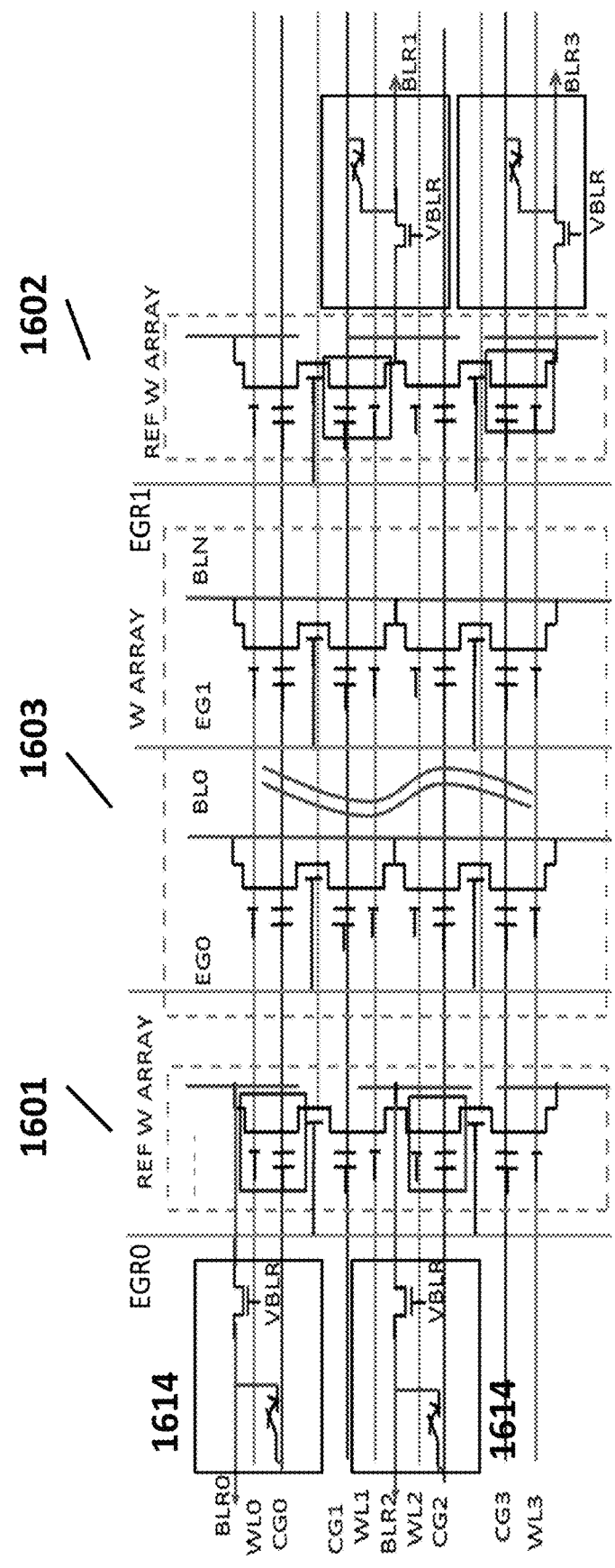
FIG. 16 depicts another embodiment of a vector multiplier matrix.

FIG. 16 depicts neuron VMM 1600, which is particularly suited for memory cells of the type shown in FIG. 3, and is utilized as the synapses and parts of neurons between an input layer and the next layer. VMM 1600 comprises a memory array 1603 of non-volatile memory cells, reference array 1601, and reference array 1602. EG lines are run vertically while CG and SL lines are run horizontally. VMM 1600 is similar to VMM 1400, except that VMM 1600 implements bi-directional tuning, where each individual cell can be completely erased, partially programmed, and partially erased as needed to reach the desired amount of charge on the floating gate. As shown, reference arrays 1601 and 1602 convert input current in the terminal BLR0-3 into control gate voltages CG0-3 (through the action of diode-connected reference cells through multiplexors) to be applied to the memory cells in the row direction. The current output (neuron) is in the bitline which sums all currents from the memory cells connected to the bitline.

FIG. 17 depicts operating voltages for VMM 1600. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

The prior art includes a concept known as long short-term memory (LSTM). LSTM units often are used in neural networks. LSTM allows a neural network to remember information over arbitrary time intervals and to use that information in subsequent operations. A conventional LSTM unit comprises a cell, an input gate, an output gate, and a forget gate. The three gates regulate the flow of information into and out of the cell. VMMs are particularly useful in LSTM units.

Figure 28:
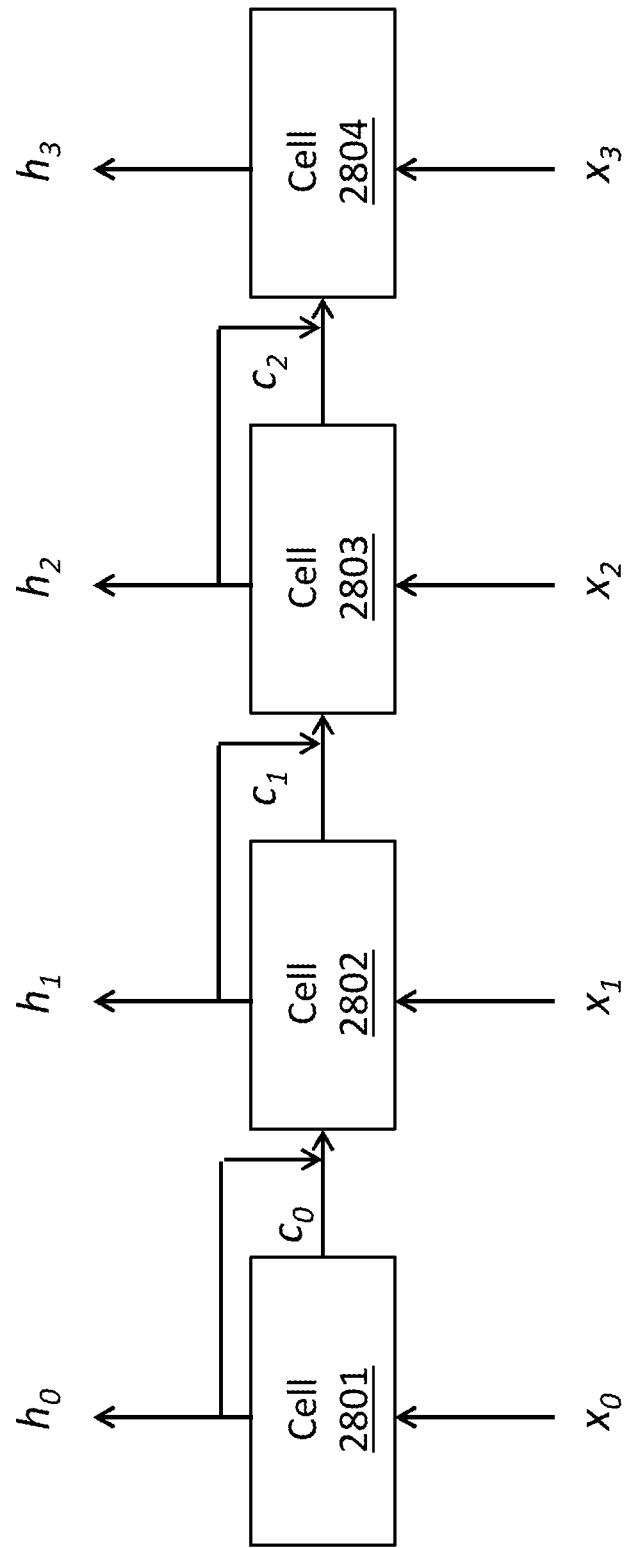
FIG. 28 depicts a prior art long short term memory system.

FIG. 28 depicts exemplary LSTM 2800. LSTM in this example comprises cells 2801, 2802, 2803, and 2804. Cell 2801 receives input vector $x_0$ and generates output vector $h_0$ and cell state vector $c_0$. Cell 2802 receives input vector $x_1$, the output vector (hidden state) $h_0$, and cell state $c_0$ from cell 2801 and generates output vector $h_1$ and cell state vector Cell 2803 receives input vector $x_2$, the output vector (hidden state) $h_1$ and cell state $c_1$ from cell 2802 and generates output vector $h_2$ and cell state vector $c_2$. Cell 2804 receives input vector $x_3$, the output vector (hidden state) $h_2$, and cell state $c_2$ from cell 2803 and generates output vector h3. Additional cells can be used, and an LSTM with four cells is merely an example.

Figure 29:
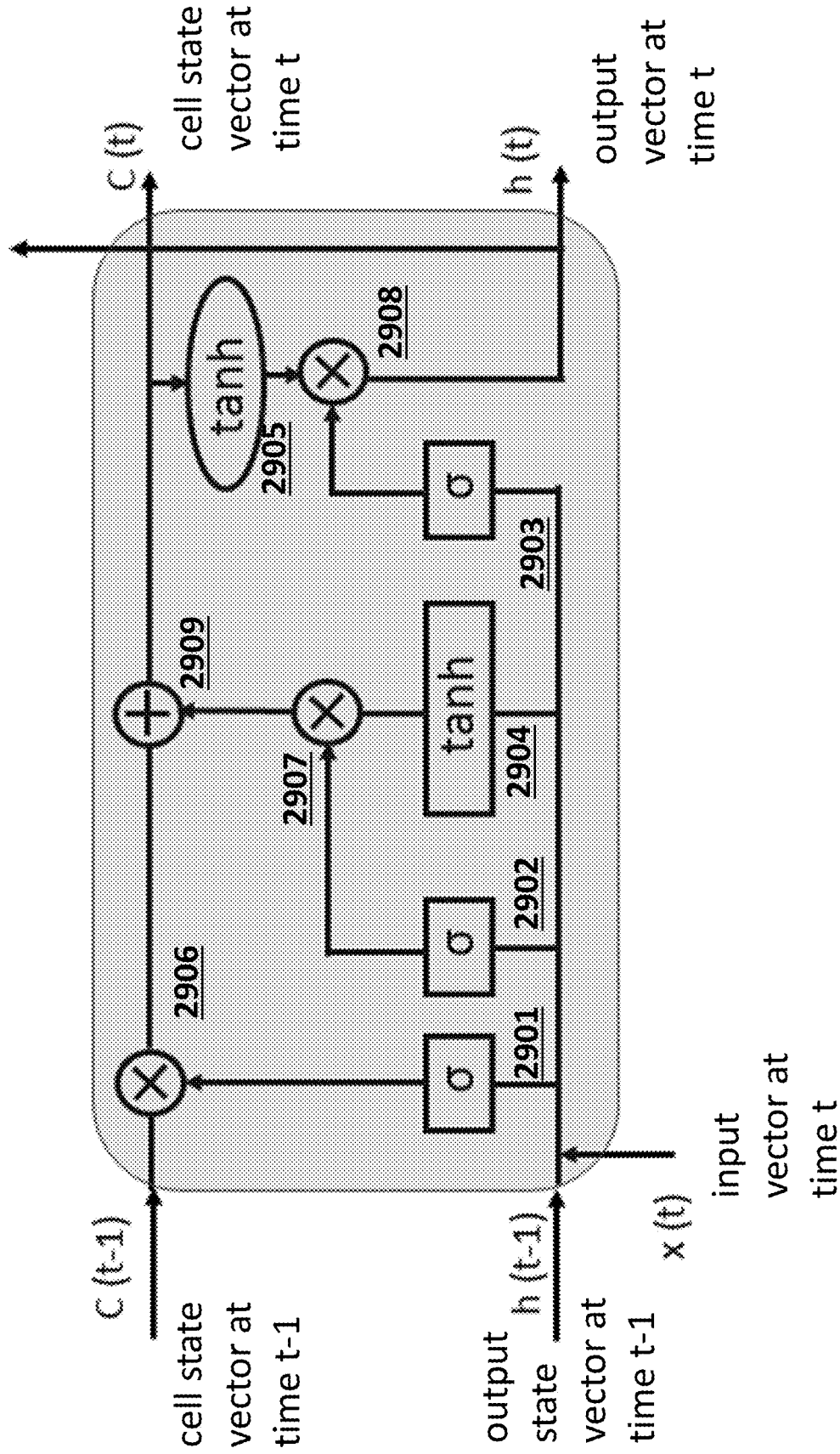
FIG. 29 depicts an exemplary cell in a prior art long short term memory system.

FIG. 29 depicts an exemplary implementation of LSTM cell 2900, which can be used for cells 2801, 2802, 2803, and 2804 in FIG. 28. LSTM cell 2900 receives input vector x(t) and cell state vector c(t-1) from a preceding cell and generates cell state(t) and output vector h(t).

LSTM cell 2900 comprises sigmoid function devices 2901, 2902, and 2903, each of which applies a number between 0 and 1 to control how much of each component in the input vector is allowed through to the output vector. LSTM cell 2900 also comprises tank devices 2904 and 2905 to apply a hyperbolic tangent function to an input vector, multiplier devices 2906, 2907, and 2908 to multiply two vectors together, and addition device 2909 to add two vectors together.

Figure 30:
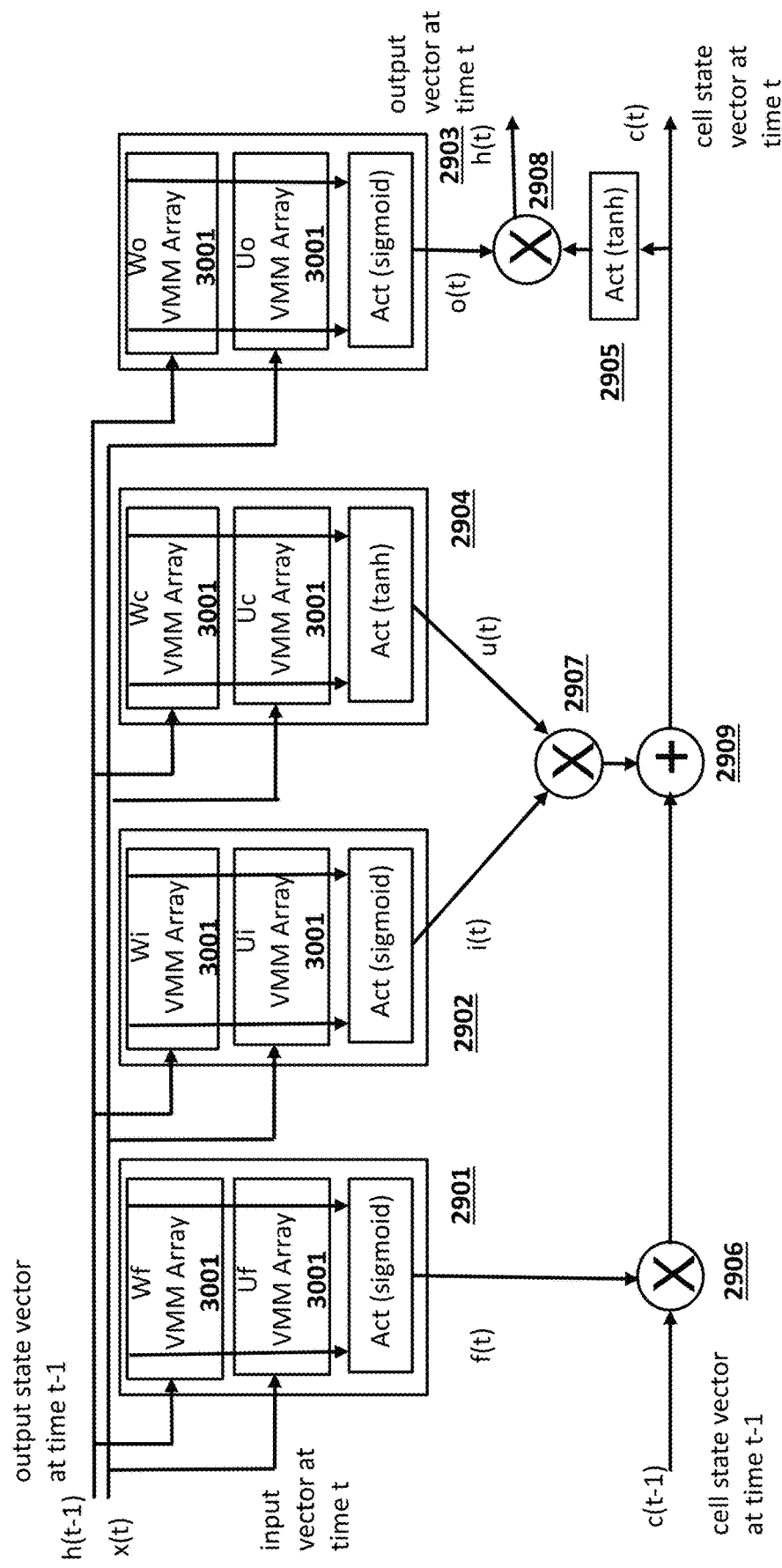
FIG. 30 depicts an implementation of the exemplary cell in the long short term memory system of FIG. 29.

FIG. 30 depicts LSTM cell 3000, which is an example of an implementation of LSTM cell 2900. For the reader's convenience, the same numbering from FIG. 29 and LSTM cell 2900 is used in FIG. 30 and LSTM cell 3000. As can be seen in FIG. 30, sigmoid function devices 2901, 2902, and 7903 and tank devices 2904 and 2905 each comprise multiple VMM arrays 3001. Thus, it can be seen that VMM arrays are particular important in LSTM cells used in certain neural network systems.

It can be further appreciated that LSTM systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Similarly, an analog VMM implementation can be used for a GRU (gated recurrent unit) system. GRUs are a gating mechanism in recurrent neural networks. GRUs are similar to LSTMs, with one notable difference being that GRUs lack an output gate.

Figure 31:
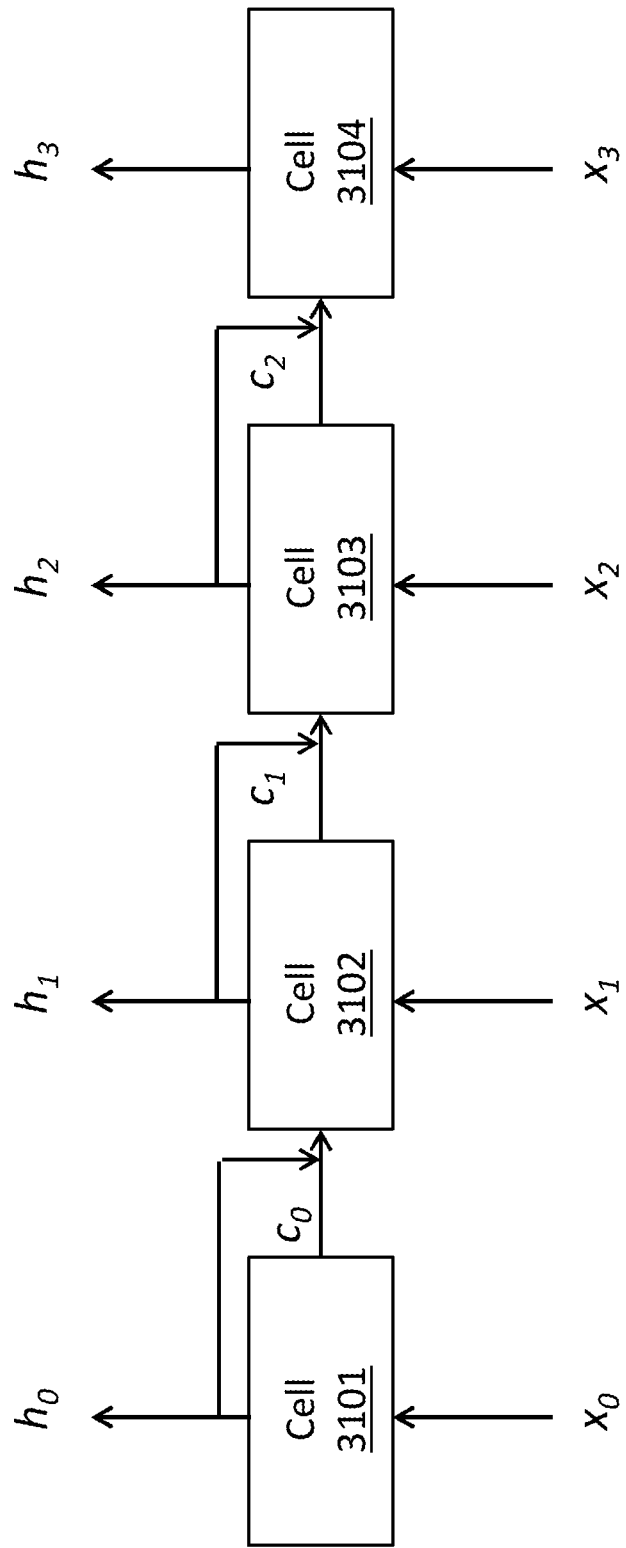
FIG. 31 depicts a prior art gated recurrent unit system.

FIG. 31 depicts exemplary GRU 3100. GRU in this example comprises cells 3101, 3102, 3103, and 3104. Cell 3101 receives input vector $x_0$ and generates output vector $h_0$ and cell state vector $c_0$. Cell 3102 receives input vector $x_1$, the output vector (hidden state) $h_0$, and cell state $c_0$ from cell 3101 and generates output vector $h_1$ and cell state vector $c_1$. Cell 3103 receives input vector $x_2$, the output vector (hidden state) $h_1$, and cell state $c_1$ from cell 3102 and generates output vector $h_2$ and cell state vector $c_2$. Cell 3104 receives input vector $x_3$, the output vector (hidden state) $h_2$, and cell state $c_2$, from cell 3103 and generates output vector h3. Additional cells can be used, and an GRU with four cells is merely an example.

Figure 32:
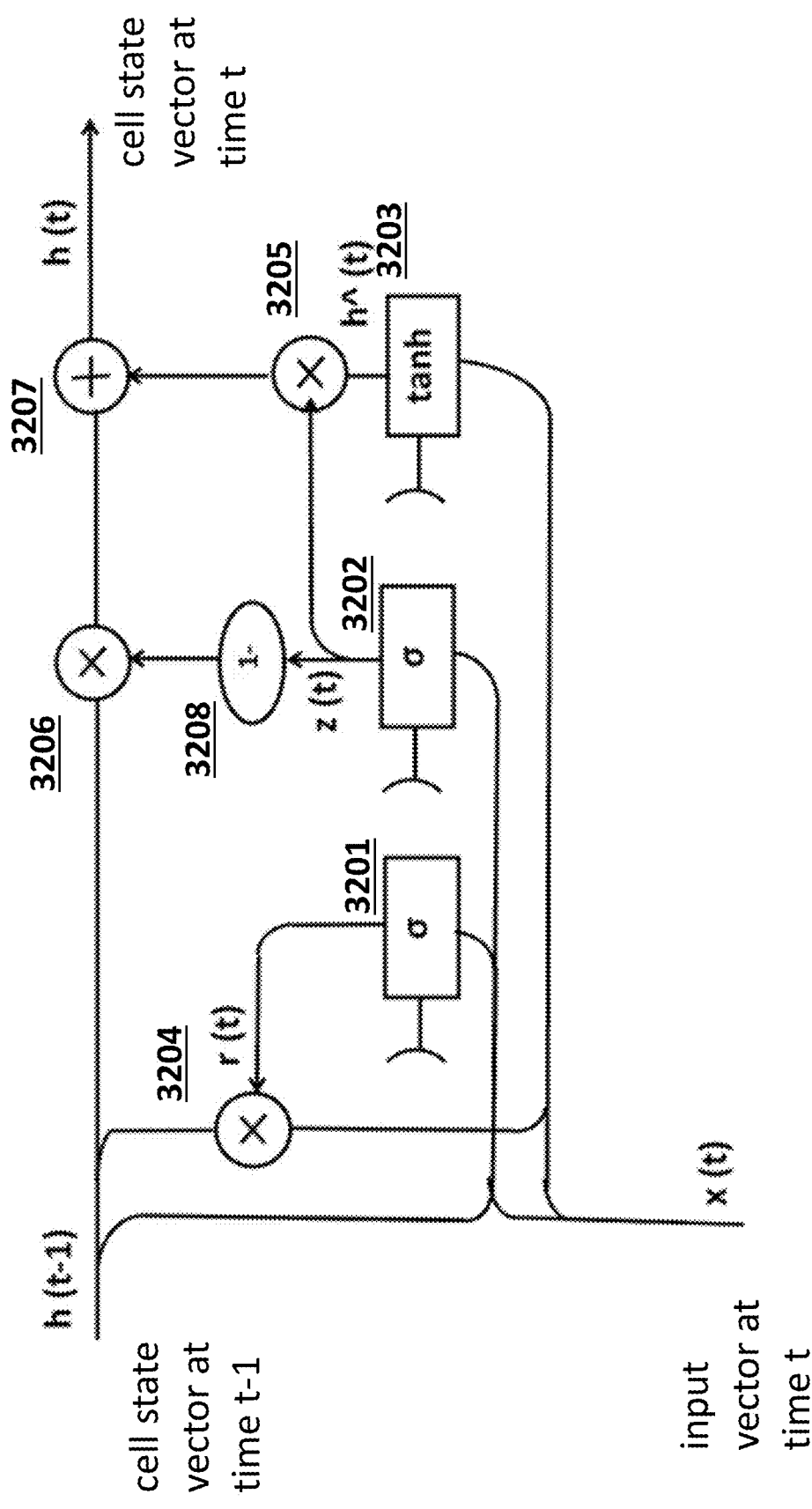
FIG. 32 depicts an exemplary cell in a prior art gated recurrent unit system.

FIG. 32 depicts an exemplary implementation of GRU cell 3200, which can be used for cells 3101, 3102, 3103, and 3104 in FIG. 31. GRU cell 3200 receives input vector x(t) and cell state vector h(t-1) from a preceding cell and generates cell state h(t). GRU cell 3200 comprises sigmoid function devices 3201 and 3202 each of which applies a number between 0 and 1 to components from cell state h(t-1) and input vector x(t). GRU cell 3200 also comprises tank device 3203 to apply a hyperbolic g function to a input vector, multiplier devices 3204, 3205, and 3206 to multiply two vectors together, addition device 3207 to add two vectors together, and complementary device 3208 to subtract an input from 1 to generate an output.

Figure 33:
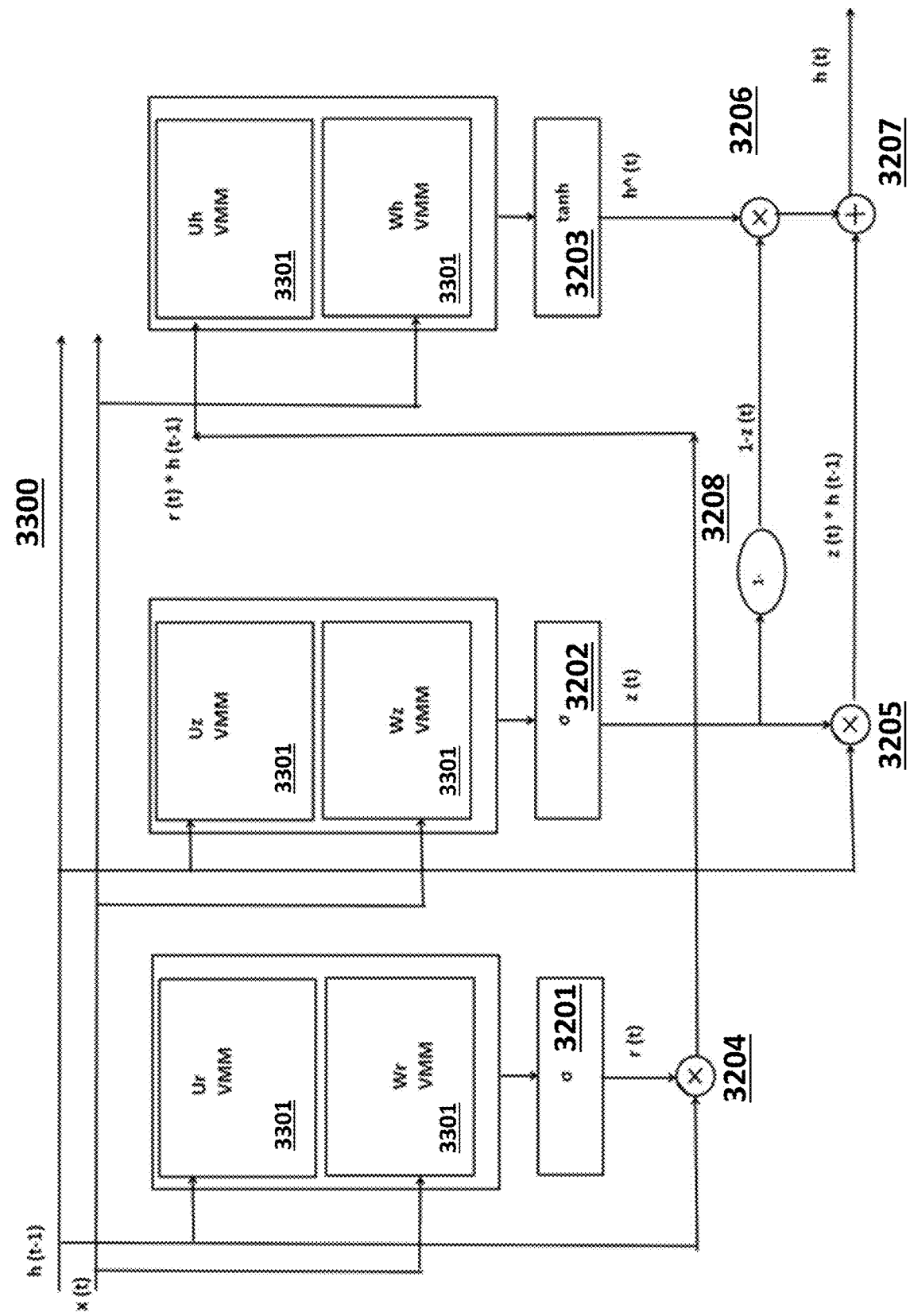
FIG. 33 depicts an implementation of the exemplary cell in the gated recurrent unit system of FIG. 32.

FIG. 33 depicts GRU cell 3300, which is an example of an implementation of GRU cell 3200. For the reader's convenience, the same numbering from FIG. 32 and GRU cell 3200 is used in FIG. 33 and GRU cell 3300. As can be seen in FIG. 33, sigmoid function devices 3201 and 3202, and tanh device 3203 each comprise multiple VMM arrays 3301. Thus it can be seen that VMM arrays are of particular use in GRU cells used in certain neural network systems.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry equired outside of the VMM arrays themselves.

Figure 18:
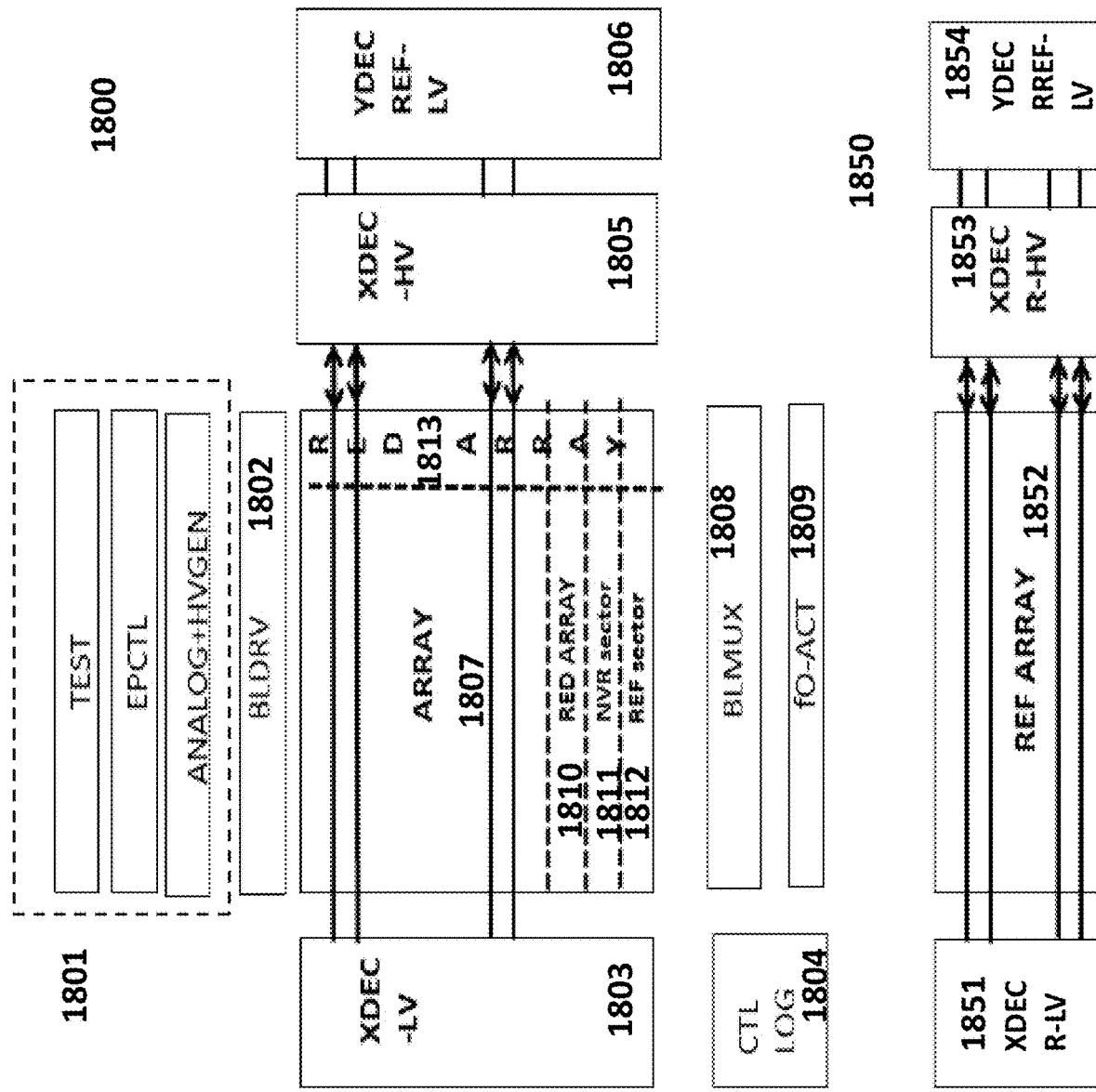
FIG. 18 depicts a memory system comprising a vector multiplier matrix and a redundancy system.

FIG. 18 depicts VMM system 1800. VMM system 1800 comprises VMM array 1807, low voltage row decoder 1803, high voltage row decoder 1805, reference cell low voltage column decoder 1806 (shown for the reference array in the column direction, meaning providing input to output conversion in the row direction), bit line PE driver 1802, bit line multiplexor 1808, activation function circuit and summer 1809, control logic 1804, and analog bias circuit 1801.

Low voltage row decoder 1803 provides a bias voltage for read and program operations and provides a decoding signal for high voltage row decoder 1805. High voltage row decoder 1805 provides a high voltage bias signal for program and erase operations. Bit line PE driver 1801 provides controlling function for bit line in program, verify, and erase. Bias circuit 1801 is a shared bias block that provides the multiple voltages needed for the various program, erase, program verify, and read operations.

VMM system 1800 further comprises redundancy array 1810 and/or redundancy array 1813. Redundancy arrays 1810 and 1813 each provide array redundancy for replacing a defective portion in array 1807, in accordance with the redundancy embodiments described in greater detail below.

VMM system 1800 further comprises NVR (non-volatile register, aka info sector) sectors 1811, which are array sectors used to store user info, device ID, password, security key, trimbits, configuration bits, manufacturing info, etc.

VMM system 1800 optionally comprises reference sector 1812 and/or reference system 1850. Reference system 1850 comprises reference array 1852, reference array low voltage row decoder 1851, reference array high voltage row decoder 1853, and reference array low voltage column decoder 1854. The reference system can be shared across multiple VMM systems.

Reference array low voltage row decoder 1851 provides a bias voltage for read and programming operations involving reference array 1852 and also provides a decoding signal for reference array high voltage row decoder 1853. Reference array high voltage row decoder 1853 provides a high voltage bias for program and operations involving reference array 1852. Reference array low voltage column decoder 1854 provides a decoding function for reference array 1852. Reference array 1852 is such as to provide reference target for program verify or cell margining (searching for marginal cells).

Figure 19:
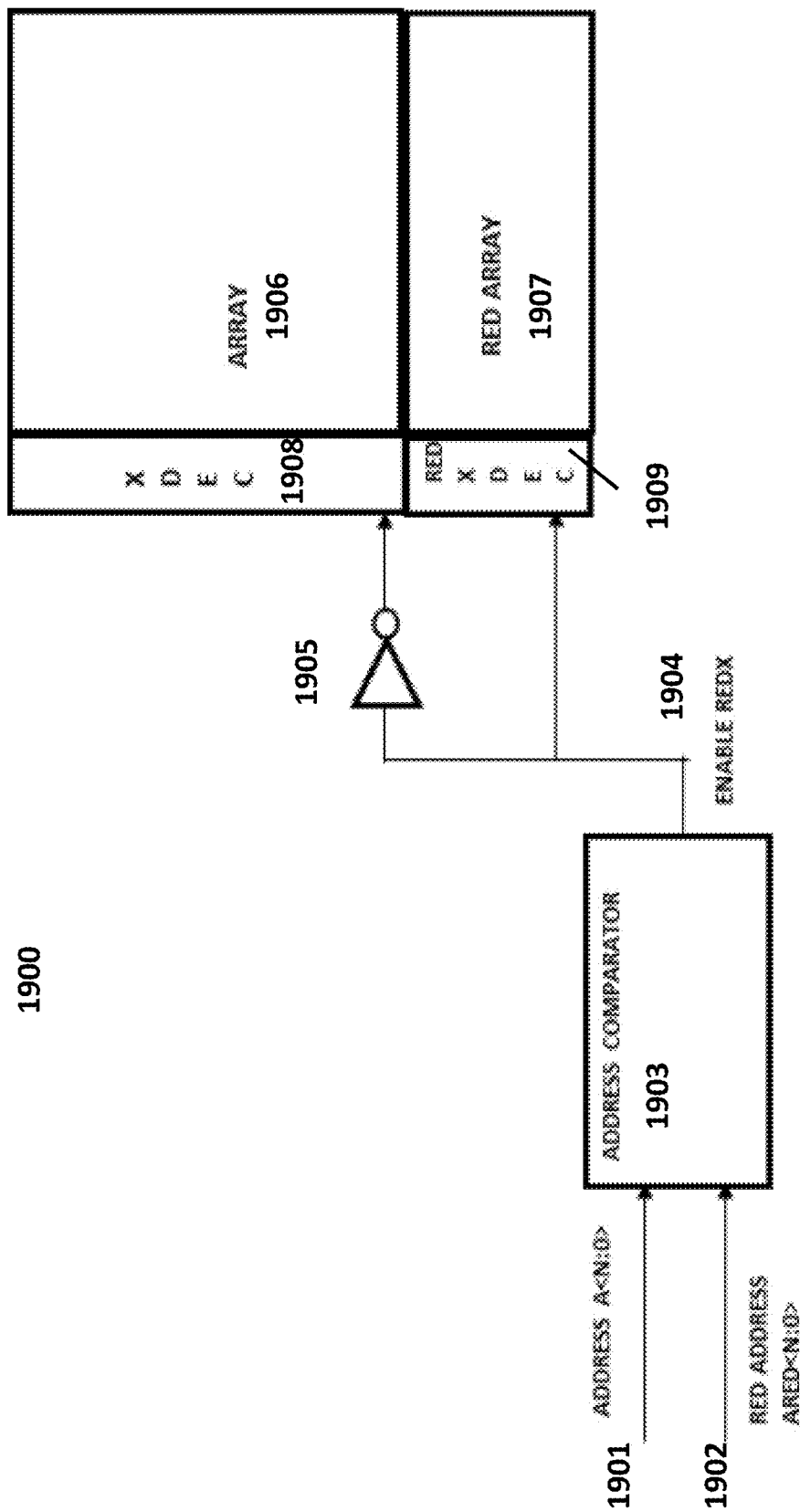
FIG. 19 depicts a prior art redundancy system.

FIG. 19 depicts prior art memory system 1900 that provides redundancy for rows containing one or more faulty memory cells during program, erase, or read operations. Memory system 1900 comprises address comparator 1903, logic circuit 1905, array 1906, redundancy array 1907, row decoder 1908, and redundancy row decoder 1909.

During a testing or configuration phase, each row of memory cells in array 1906 is tested and verified. Any memory cells deemed to be faulty are identified, and the address for each row that contains one or more faulty memory cells is stored in non-volatile memory (not shown). Thereafter, during operation of memory system 1900, each address 1901 for a read or write operation is compared by address comparator 1903 against each address in the set of stored addresses corresponding to rows containing one or more faulty memory cells.

If a match is found by address comparator 1903 with any of the stored addresses, enable signal 1904 is asserted, which signifies that the received address is for a faulty row. Enable signal 1904 is received by redundant array row decoder 1909, which then selects a row that has been assigned to the row containing the faulty memory cell. Thus, the program, erase, or read operation is directed to the redundant row instead of the row containing the faulty memory cell.

If a match is not found by address comparator 1903, then enable signal 1904 is de-asserted, and row decoder 1908 is enabled by the output of logic circuit 1905 (here shown as an inverter). In this situation, the received address 1901 is used to access a row in array 1906 for the operation.

By design, only one of the assigned redundant rows can be asserted at any given time. This prior art system therefore could not be used to perform a neural read operation, where all non-faulty rows and assigned redundant rows are asserted.

Figure 20:
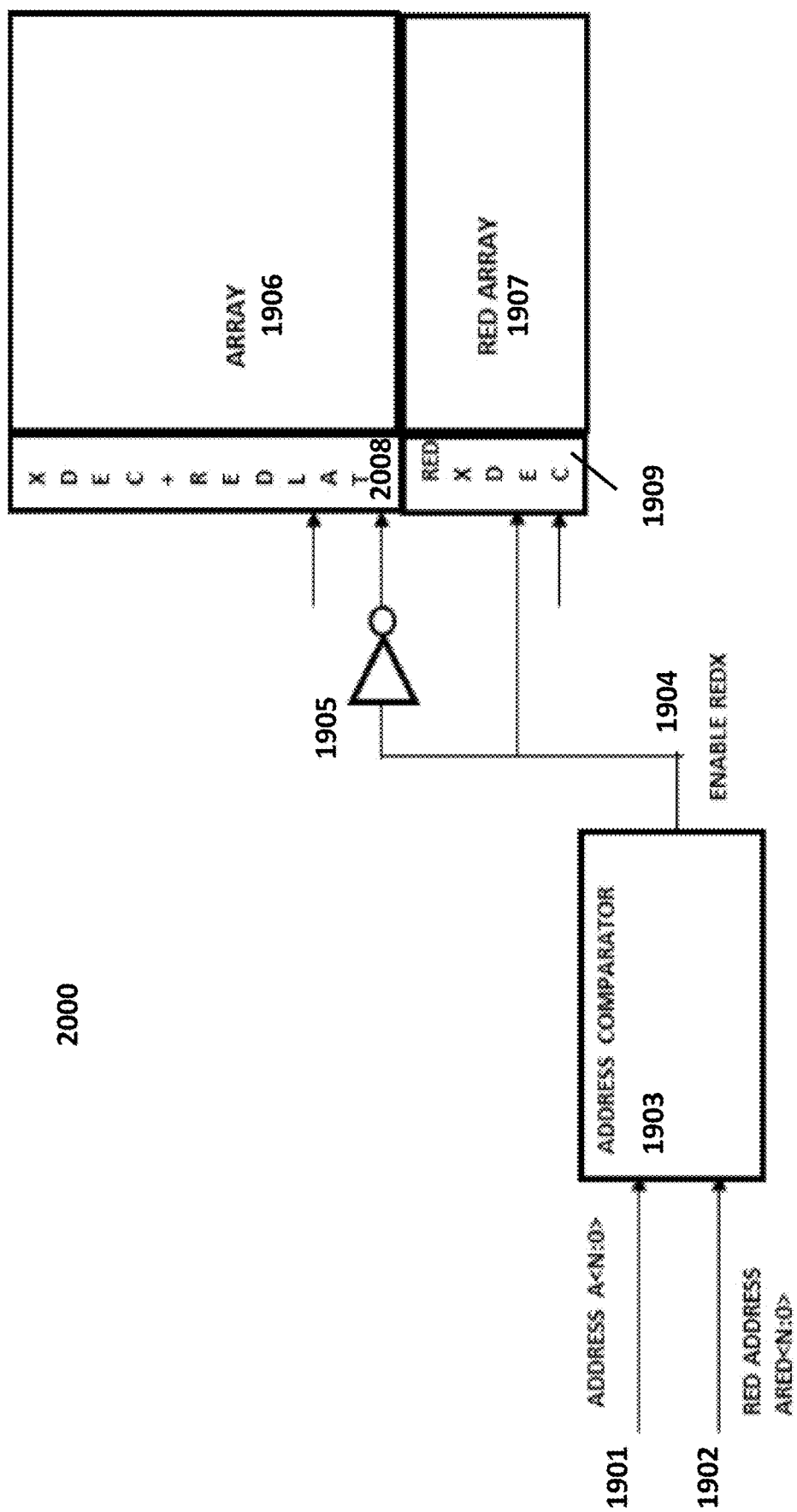
FIG. 20 depicts an embodiment of a redundancy system for a vector multiplier matrix.

FIG. 20 depicts an embodiment of an improved memory system. Memory system 2000 provides redundancy for rows containing one or more bad memory cells. Unlike memory system 1900, memory system 2000 is able to assert all assigned redundant rows during a neural read operation, and it also can perform a program, erase, or read operation as in memory system 1900. Memory system 2000 contains the same components as memory system 1900 except that row decoder and redundancy latch block 2008 is used instead of row decoder 1908. Row decoder and redundancy latch block 2008 contains circuitry that enables all assigned redundant rows to be asserted during a neural read operation.

Figure 21:
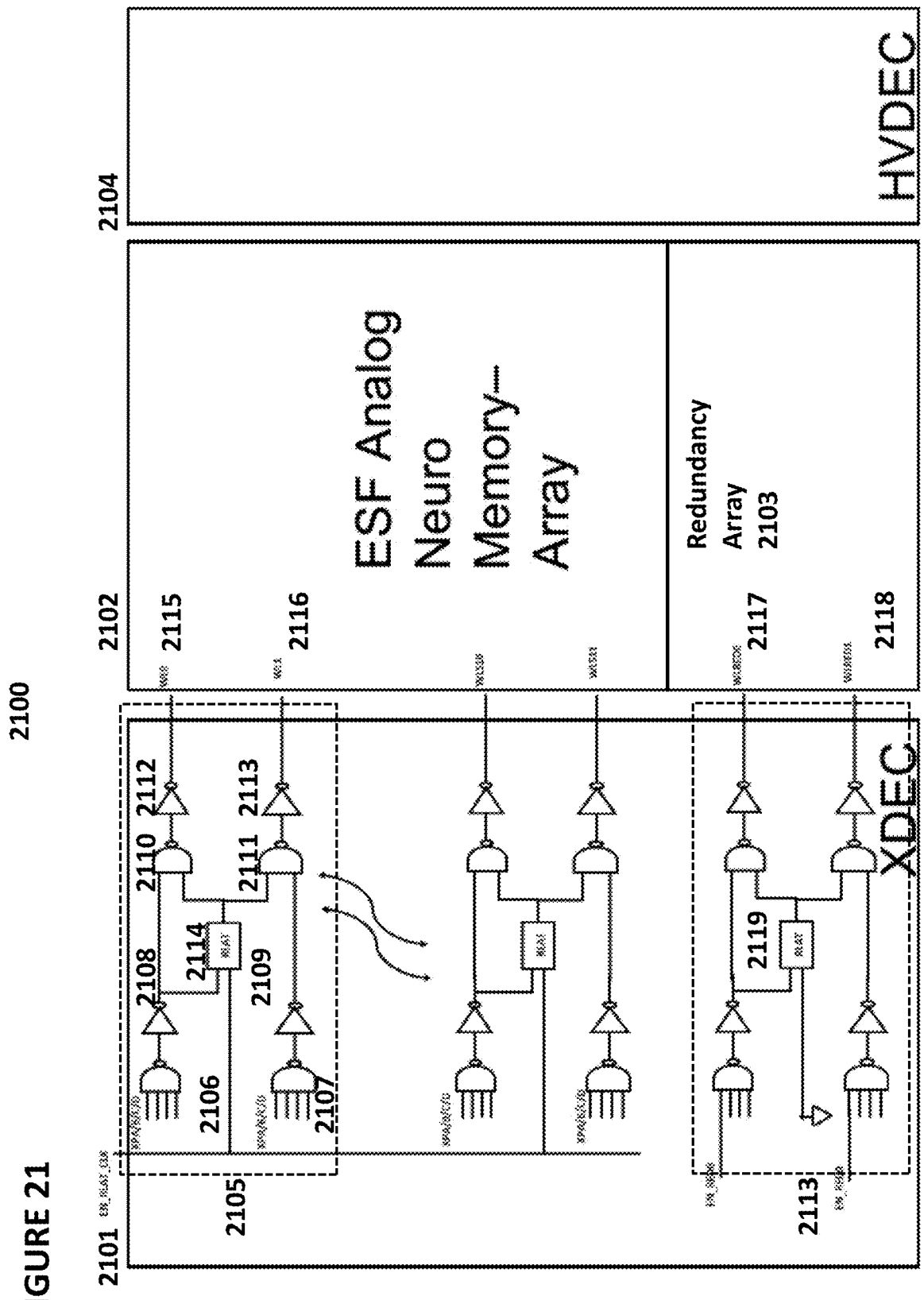
FIG. 21 depicts another embodiment of a redundancy system for a vector multiplier matrix.

FIG. 21 depicts further detail regarding an embodiment of row decoder and redundancy latch block 2008, here shown as row decoder and redundancy latch block 2101. Memory system 2100 comprises row decoder and redundancy latch block 2101, array 2102, redundancy array 2103, and high voltage decoder 2104. Row decoder and redundancy latch block 2101 comprises numerous instances of sub-block 2105, where each instance of sub-block 2105 is coupled to a pair of word lines in array 2102 (here, word lines 2115 and 2116). Thus, in this embodiment, sub-block 2105 and similar sub-blocks each are coupled to a sector of memory in array 2102. In an alternative embodiment, each sub-clock can be coupled to more than two rows.

Row decoder and redundancy latch block 2101 further comprises redundancy sub-block 2113 coupled to a pair of word lines in redundancy array 2103 (here, word lines 2117 and 2118). Additional redundancy sub-blocks similar to redundancy sub-block 2113 can be included in row decoder and redundancy latch block 2101.

Sub-block 2105 comprises NAND gates 2106 and 2107, inverters 2108 and 2109, NAND gates 2110 and 2111, inverters 2112 and 2113, and latch 2114. Latch 2114 is programmed (or loaded with configuration data at power-up or in response to a redundancy load command) during a testing or configuration phase. If word lines 2115 or 2116 are coupled to a row containing one or more faulty memory cells, then a "1" will be programmed into latch 2114. Otherwise, latch 2114 will store a "0". During normal operation, when NAND gates 2106 or 2107 receive an address corresponding to word lines 2115 or 2116, respectively, latch 2114 will cause that word line to be de-asserted instead of asserted. Thus, the word line containing the faulty memory cell will not be selected.

Redundancy sub-block 2113 contains similar components as sub-block 2105. Here, latch 2119 is programmed during a testing or configuration phase. If word lines 2117 or 2118 are to be used, then latch 2119 is programmed with a "0". Otherwise, latch 2119 is programmed with a "1". During normal operation, when the receiving NAND gate receives an address corresponding to word lines 2117 or 2118, latch 2119 will cause that word line to be asserted. Thus, the word line containing the redundancy memory cells will be selected. Notably, multiple redundant rows can be selected at any given time (such as during a neural read operation) by configuring latches such as latch 2119 with a "0".

Figure 22:
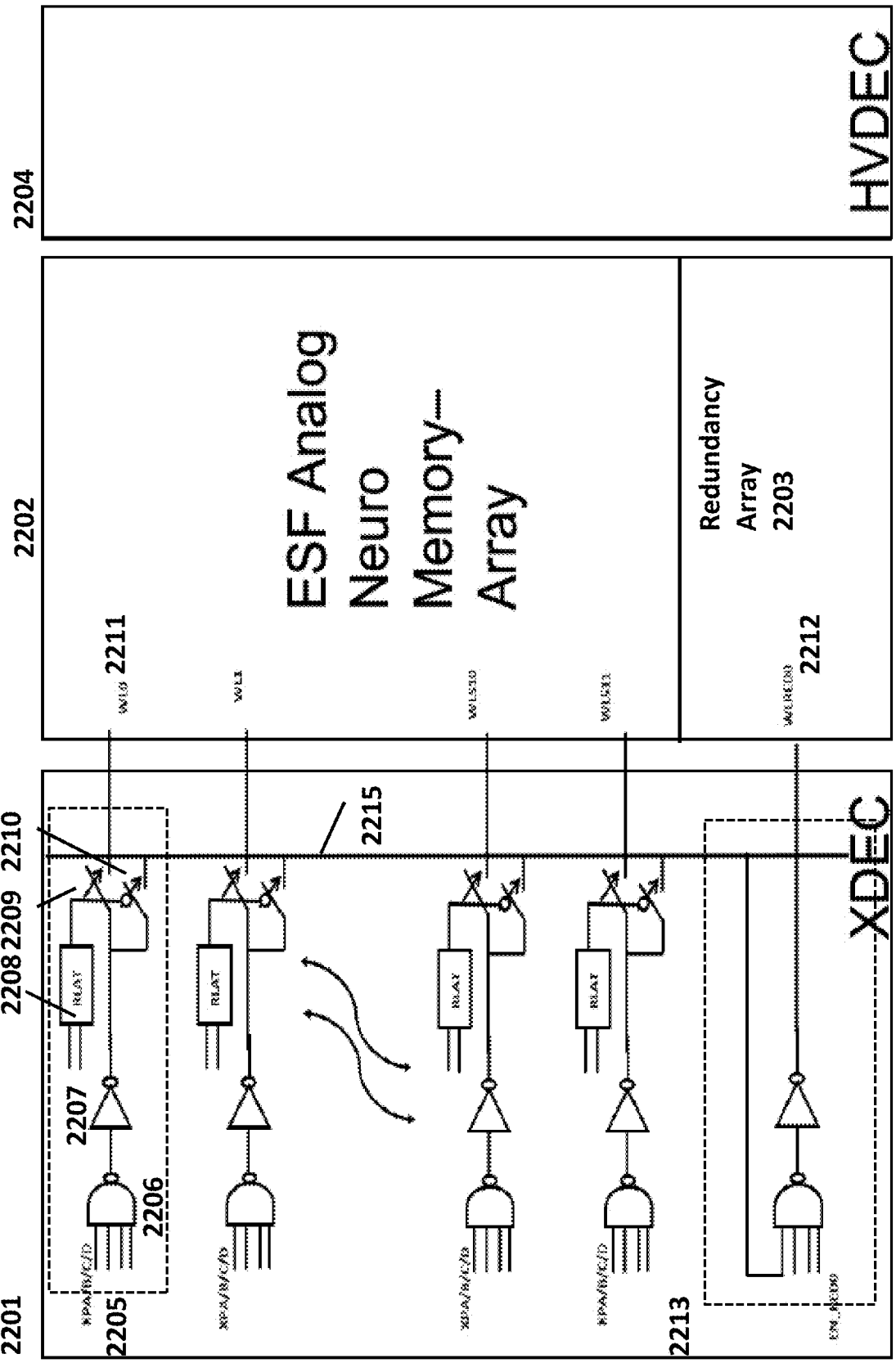
FIG. 22 depicts another embodiment of a redundancy system for a vector multiplier matrix.

FIG. 22 depicts further detail regarding another embodiment of row decoder and redundancy latch block 2008, here shown as row decoder and redundancy latch block 2201. Memory system 2200 comprises row decoder and redundancy latch block 2201, array 2202, redundancy array 2203, and high voltage decoder 2204. Row decoder and redundancy latch block 2201 contains numerous instances of sub-block 2205, where each instance of sub-block 2205 is coupled to a word line in array 2202 (here, word line 2211).

Thus, in this embodiment, sub-block 2205 and similar sub-blocks each are coupled to a sector of memory in array 2202.

Row decoder and redundancy latch block 2201 further comprises redundancy block 2213 coupled to a redundant word line in redundancy array 2203 (here, word line 2212).

Sub-block 2205 comprises NAND gate 2206, inverter 2207, latch 2208, and switches 2209 and 2210. Here, redundancy latch 2208 is programmed during a configuration stage of memory system 2200. If latch 2208 contains a "1", then the corresponding row coupled to word line 2211 in array 2202 is not faulty. During normal operation, switch 2209 will be closed and switch 2210 will be open, and word line 2211 in array 2202 will be accessed when the appropriate address is received. If latch 2208 contains a "0", then the corresponding row in array 2202 is faulty. During normal operation, switch 2209 will be open and switch 2109 will be closed, and word line 2211 in array 2202 will not be accessed when the appropriate address is received. Instead, redundant word line 2212 in array 2202 will be accessed through a vertical line 2215.

Figure 23:
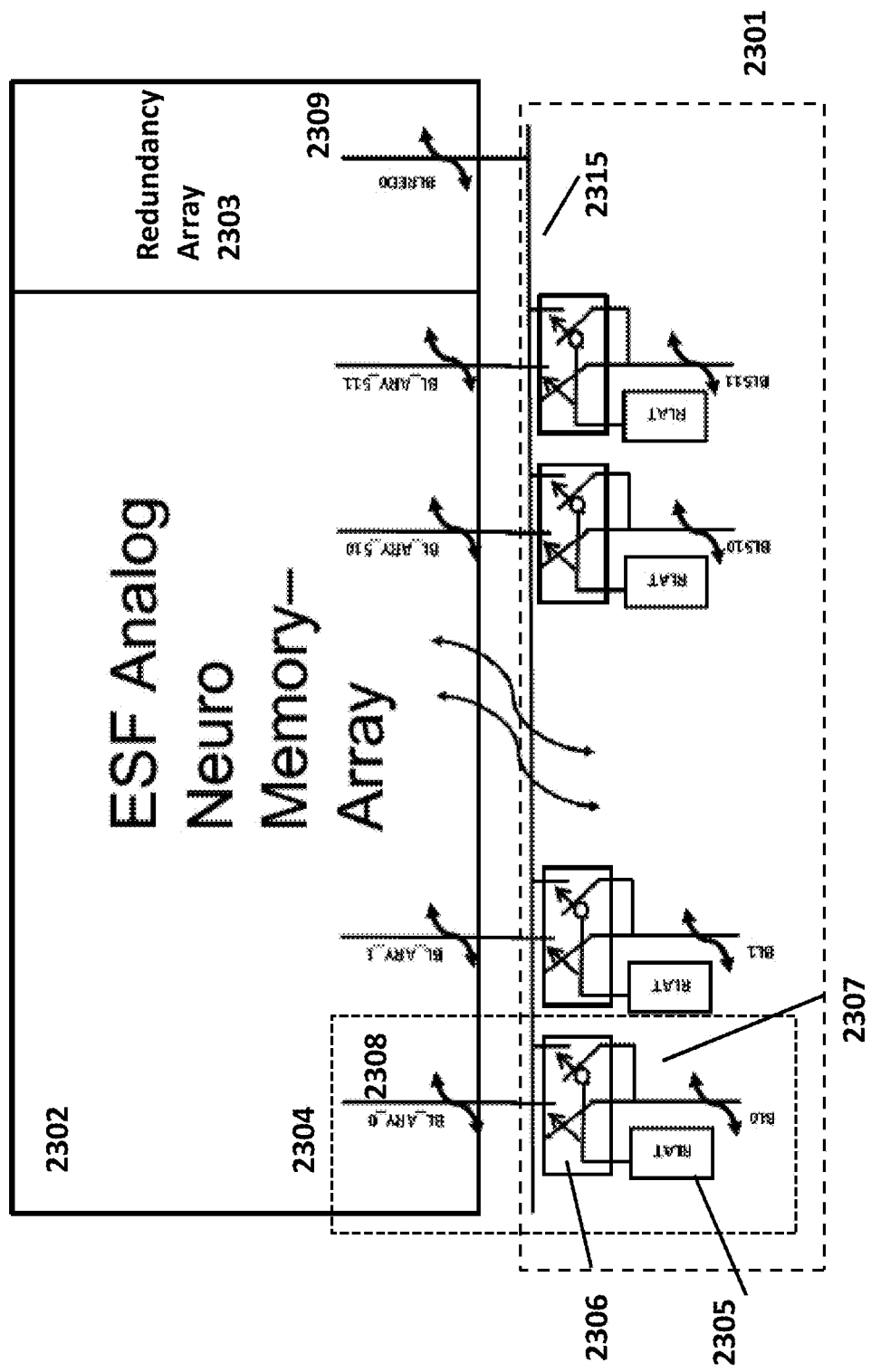
FIG. 23 depicts another embodiment of a redundancy system for a vector multiplier matrix.

FIG. 23 depicts another embodiment of the inventive concepts. Memory system 2300 comprises column decoder and redundancy latch block 2301, array 2302, and redundancy array 2303. Column decoder and redundancy latch block 2301 contains numerous instances of sub-block 2304, where each instance of sub-block 2304 is selectively coupled to a bit line or a group of bitlines (here, bit line 2308) in array 2302. Sub-block 2304 comprises latch 2305, switch 2306, and switch 2307.

Latch 2305 is programmed during a testing or configuration stage of memory system 2300. If latch 2305 contains a "1", then the corresponding column coupled to bit line 2308 is not faulty. During normal operation, switch 2306 will be closed and switch 2307 will be open, and bit line 2308 will be accessed when the appropriate address is received. If latch 2305 contains a "0", then the corresponding column in array 2302 is faulty. During normal operation, switch 2306 will be open and switch 2307 will be closed, and bit line 2308 in array 2202 will not be accessed when the appropriate address is received. Instead, redundant bit line 2309 in redundancy array 2303 will be accessed through a horizontal line 2315.

Figure 24:
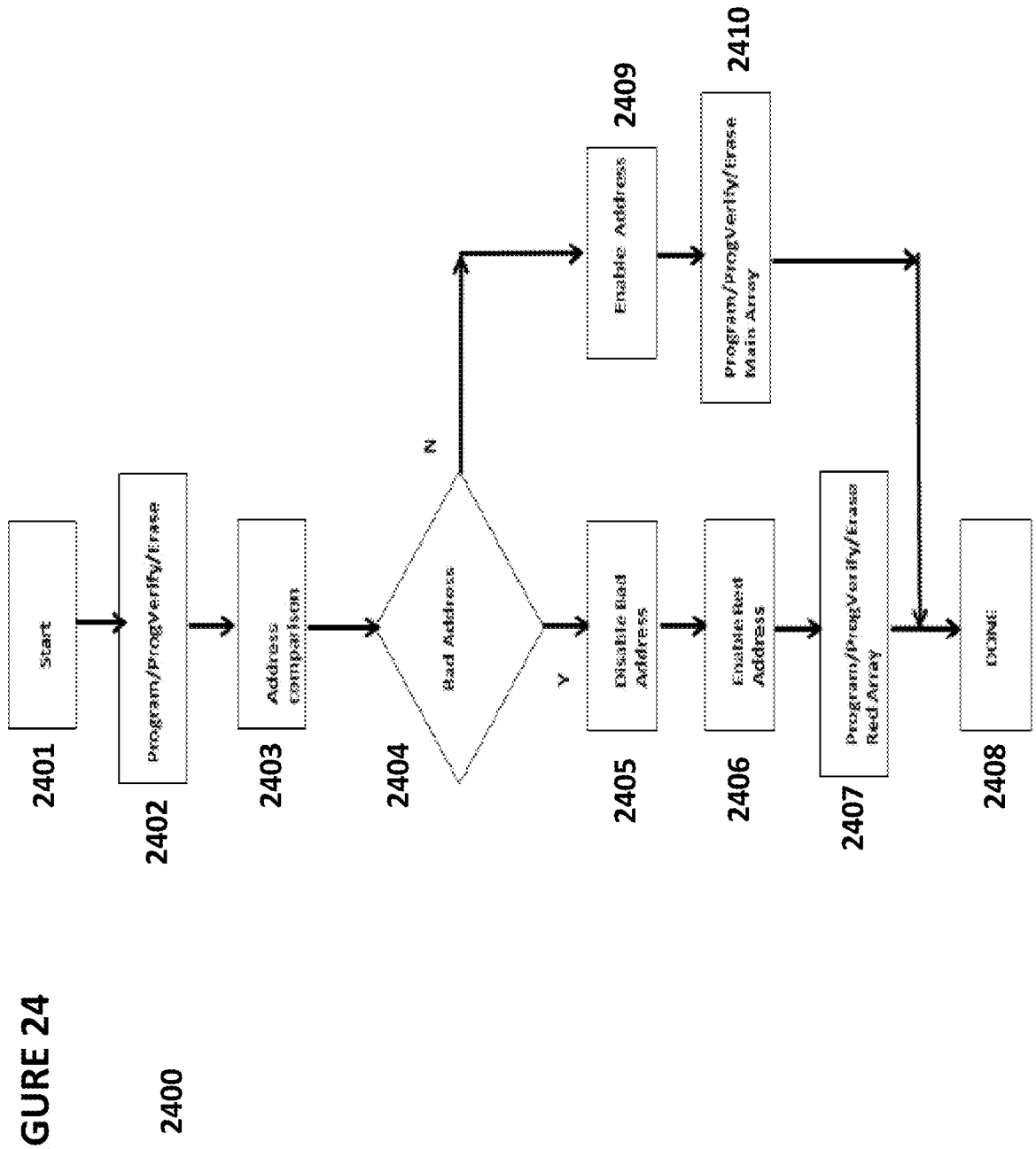
FIG. 24 depicts an embodiment of a method of accessing redundant memory cells in place of faulty memory cells during a program, read, or erase operation.

FIG. 24 depicts program, program verify, and erase method 2400. The process starts (step 2401). A program, program verify, or erase command is received (step 2402). The received address is compared against the addresses for known bad rows or columns in a memory array (step 2403).

If a match is found (step 2404), that means a bad address exists. The system will disable the bad address (step 2405) and enable a corresponding redundant address (step 2406). The program, program verify, or erase command is then executed using the redundant address (step 2407). The process is then complete (step 2408).

If a match is not found (step 2404), the received address is enabled (step 2409). The program, program verify, or erase command is then executed using the received address (step 2410). The process is then complete (step 2408).

Figure 25:
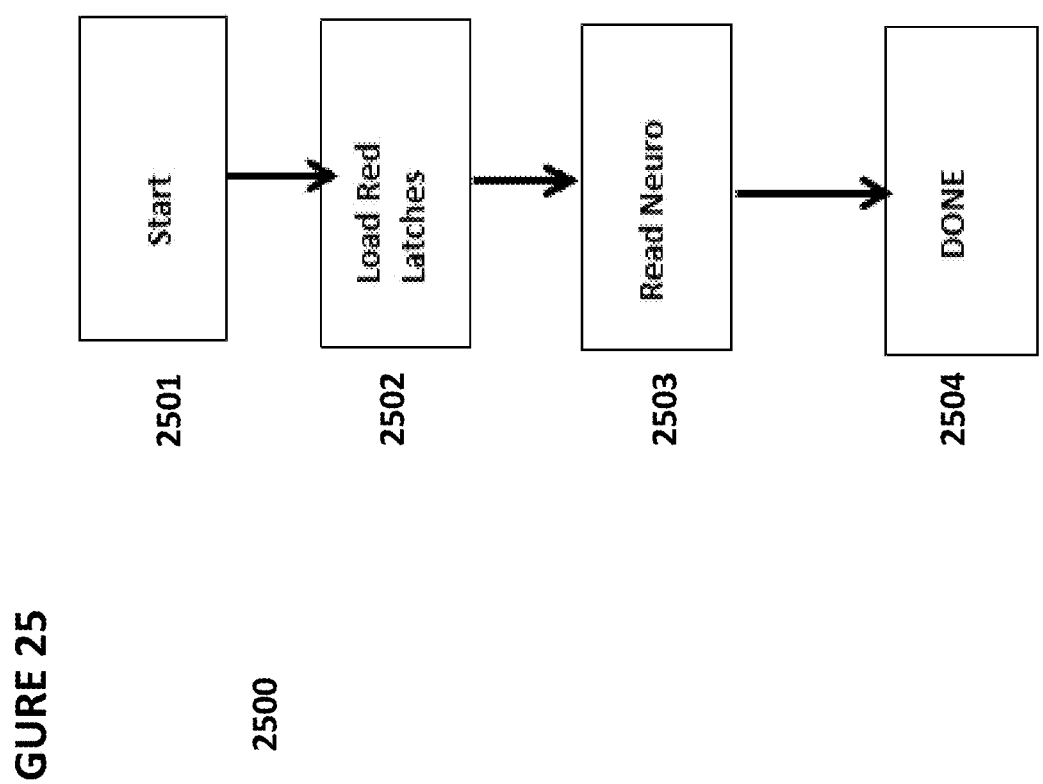
FIG. 25 depicts an embodiment of a method of accessing redundant memory cells in place of faulty memory cells during a neural read operation.

FIG. 25 depicts an embodiment for neural read process 2500. The process starts (step 2501). Redundancy latches are loaded or configured with redundancy information (step 2502). A neural read operation occurs, whereby the entire array and redundancy array are enabled except for the bad rows or columns (step 2503). The process is them complete (step 2504).

Figure 26:
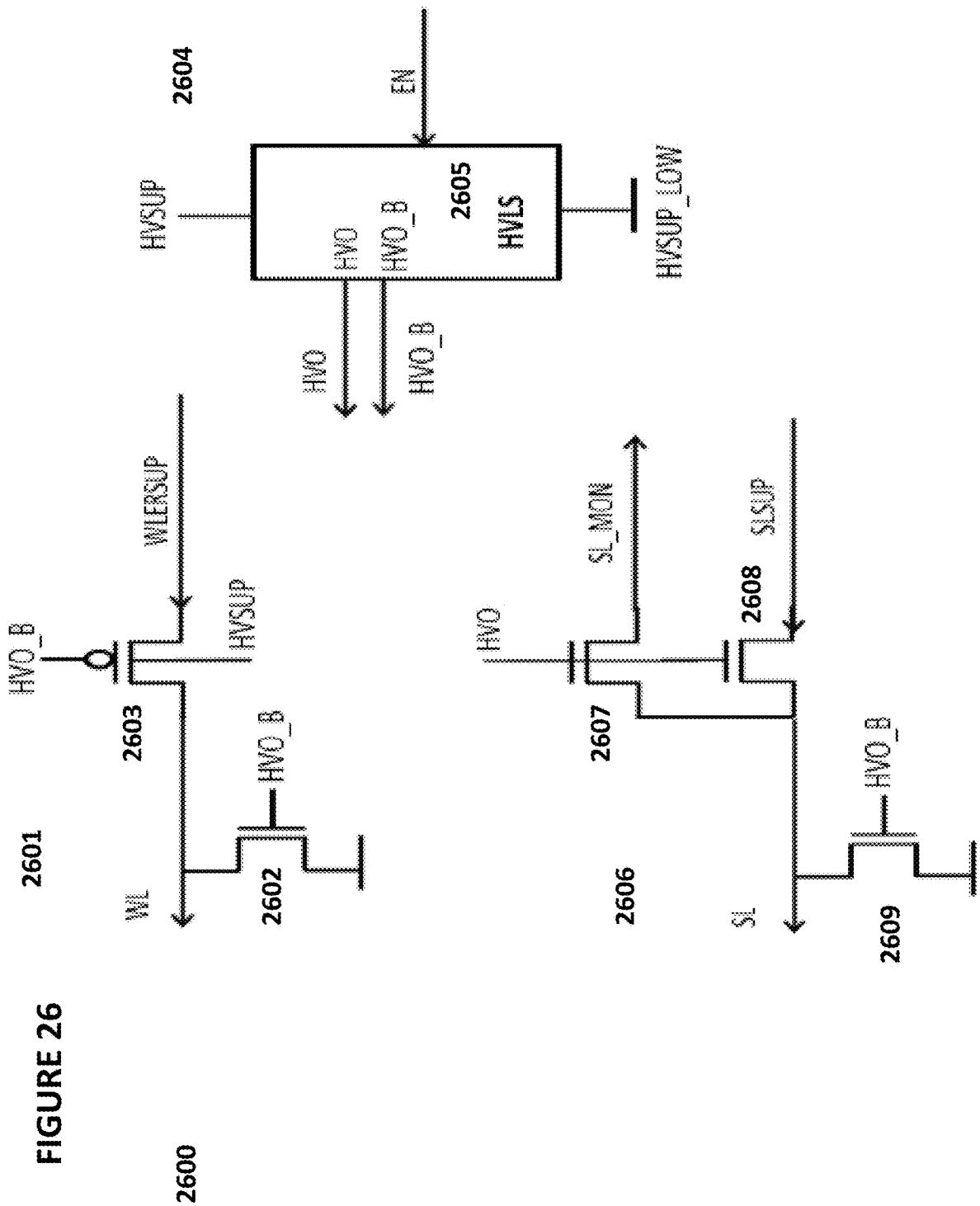
FIG. 26 depicts an embodiment of a decoding system for use with a vector multiplier matrix.

FIG. 26 depicts decoding circuitry 2600 that is suitable for use with arrays containing memory cells of the type shown in FIG. 2. Decoding circuitry 2600 comprises word line decoder 2601, high voltage supply 2604, and source line decoder 2606. Word line decoder 2601 comprises PMOS transistor 2603 and NMOS transistor 2602, configured as shown. Source line decoder 2606 comprises NMOS transistors 2607, 2608, and 2609, configured as shown. High voltage supply 2604 comprises high voltage logic supply 2605.

Figure 27:
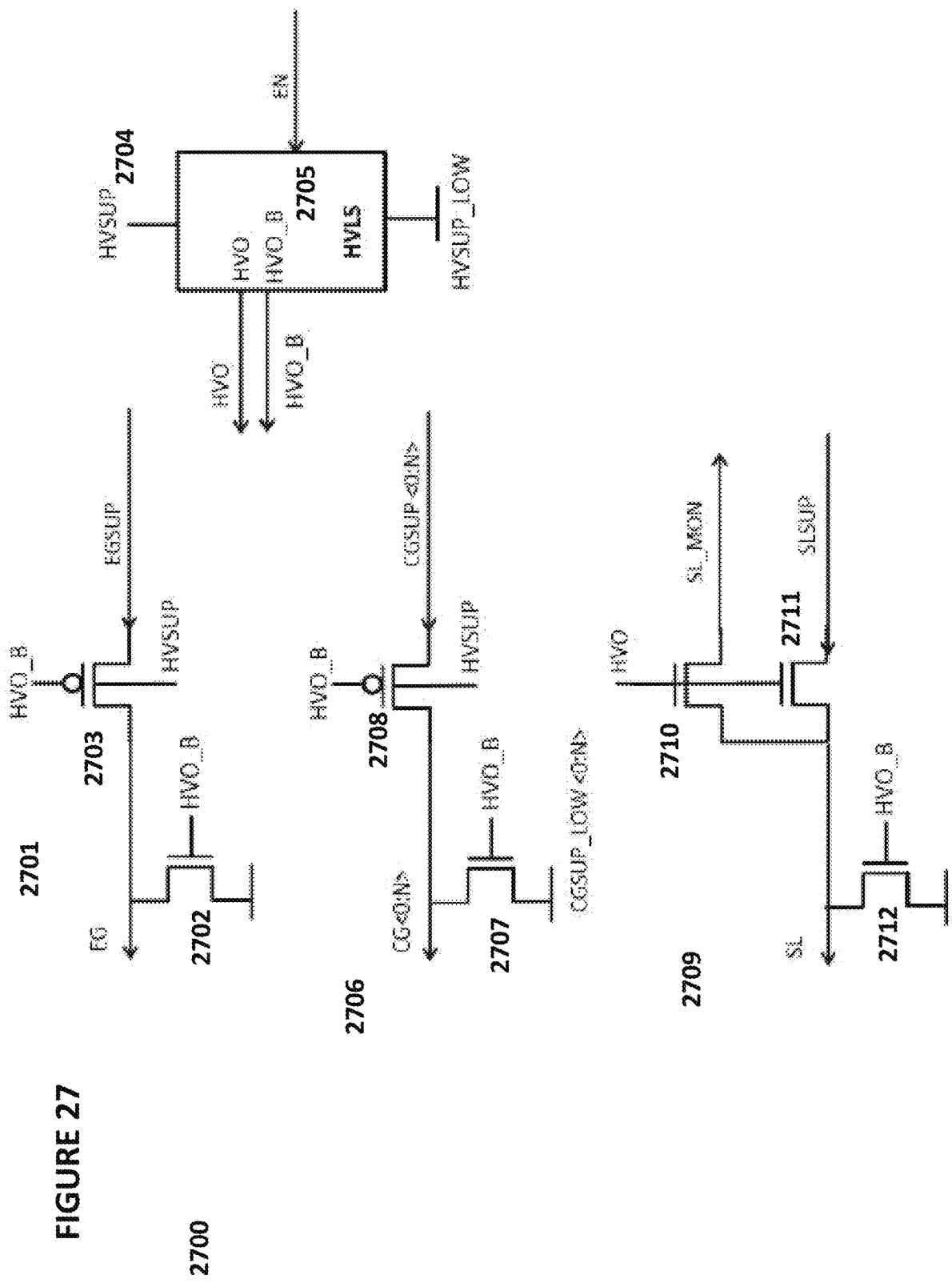
FIG. 27 depicts another embodiment of a decoding system for use with a vector multiplier matrix.

FIG. 27 depicts decoding circuitry 2700 that is suitable for use with arrays containing memory cells of the type shown in FIG. 3. Decoding circuitry 2700 comprises erase gate line decoder 2701, control gate decoder 2706, source line decoder 2709, and high voltage supply 2704. Erase gate decoder 2701 comprises PMOS transistor 2703 and NMOS transistor 2702, configured as shown. Control gate decoder 2706 comprises PMOS transistor 2708 and NMOS transistor 2707. Source line decoder 2709 comprises NMOS transistors 2710, 2711, and 2712, configured as shown. High voltage supply 2704 comprises high voltage logic supply 2705.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A method of performing a neural read operation in a memory system comprising a memory array and a redundant memory array, the method comprising:
    loading data into one or more latches;
    disabling a plurality of rows of memory cells in the memory array in response to the one or more latches;
    enabling a plurality of rows of memory cells in the redundant memory array; and
    performing a concurrent read operation of all memory cells in non-disabled rows in the memory array and all memory cells in the plurality of enabled rows in the redundant memory array.

2. The method of claim 1, further comprising:
    receiving a current on each output line in the memory array and redundant memory array, wherein the current on each output line comprises current drawn during the concurrent read operation by each memory cell in a non-disabled row in the memory array coupled to the output line and each memory cell in the plurality of enabled rows in the redundant memory array coupled to the output line.

3. The method in claim 2, wherein the output line is a bitline.

4. The method in claim 2, wherein the output line is a source line.

5. The method of claim 1, wherein the disabling utilizes discrete logic.

6. The method of claim 1, wherein the disabling utilizes one or more switches.

7. The method of claim 1, wherein each of the one or more latches is coupled to word lines for a sector of memory cells in the memory array.

8. The method of claim 1, wherein each of the memory cells in the memory array and each of the memory cells in the redundant memory array is a split-gate flash memory cell.

9. The method of claim 1, further comprising performing an address comparison during a programming or erasing operation to determine if an address corresponds to faulty memory.

10. The method of claim 9, wherein the redundant memory array is enabled for a program or erase operation if an address comparison identifies a match.

11. A method of performing a neural read operation in a memory system comprising a memory array and a redundant memory array, the method comprising:
loading data into one or more latches;
disabling a plurality of columns of memory cells in the memory array in response to the one or more latches;
enabling a plurality of columns of memory cells in the redundant memory array; and
performing a concurrent read operation of all memory cells in non-disabled columns in the memory array and all memory cells in the plurality of enabled columns in the redundant memory array.

12. The method of claim 11, further comprising:
receiving a current on each output line in the memory array and redundant memory array, wherein the current on each output line comprises current drawn during the read operation by each memory cell in a non-disabled column in the memory array coupled to the output line and each memory cell in an enabled column in the redundant memory array coupled to the output line.

13. The method of claim 12, wherein the output line is a bitline.

14. The method of claim 12, wherein the output line is a source line.

15. The method of claim 11, wherein the disabling is performed by one or more switches.

16. The method of claim 11, wherein each of the memory cells in the memory array and each of the memory cells in the redundant memory array is a split-gate flash memory cell.

17. The method of claim 11, further comprising performing an address comparison during a programming or erasing operation to determine if an address corresponds to faulty memory.

18. The method of claim 17, wherein the redundant memory array is enabled for a program or erase operation if an address comparison identifies a match.

19. A memory system comprising:
a memory array comprising a plurality of sectors, each sector comprising a plurality of rows of memory cells;
a redundant memory array comprising a plurality of redundant sectors, each redundant sector comprising a plurality of rows of memory cells;
for each sector in the memory array, a control block comprising a latch, wherein the latch can be programmed to disable one or more rows in the sector in the memory array; and
for each sector in the redundant memory array, a control block comprising a redundancy latch, wherein the redundancy latch can be programmed to enable one or more rows in a redundant sector in the redundant memory array;
wherein, during a neural read operation, a concurrent read operation is performed of all memory cells in non-disabled rows in the memory array and all memory cells in the enabled rows in the redundant memory array.

20. The system of claim 19, further comprising:
circuitry for receiving a current on each bit line in the memory array and redundant memory array, wherein the current on each bit line comprises current drawn during the read operation by each memory cell in a non-disabled row in the memory array coupled to the bit line and each memory cell in an enabled row in the redundant memory cell coupled to the bit line.

21. The system of claim 19, further comprising:
for each sector in the memory array, discrete logic between the latch and the memory array.

22. The system of claim 19, further comprising:
for each sector in the memory array, one or more switches between the latch and the memory array.

23. The system of claim 19, wherein each of the memory cells in the memory array and each of the memory cells in the redundant memory array is a split-gate flash memory cell.

24. The system of claim 19, wherein the memory array is a vector-by-matrix multiplication array in a long short term memory system.

25. The system of claim 19, wherein the memory array is a vector-by-matrix multiplication array in a gated recurrent unit system.

26. A memory system comprising:
a memory array comprising memory cells arranged in rows and columns, wherein each column of memory cells is coupled to a bit line;
a redundant memory array comprising redundant memory cells arranged in rows and columns, wherein each column of redundant memory cells is coupled to a bit line;
for each bit line in the memory array, a control block comprising a latch, wherein the latch can be programmed to disable the column of memory cells coupled to the bit line in the memory array; and
for each bit line in the redundant memory array, a control block comprising a redundancy latch, wherein the redundancy latch can be programmed to enable a column of memory cells coupled to the bit line in the redundant memory array;
wherein, during a neural read operation, a concurrent read operation is performed of all memory cells in non-disabled columns in the memory array and all memory cells in the enabled columns in the redundant memory array.

27. The system of claim 26, further comprising:
circuitry for receiving a current on each bit line coupled to a non-disabled column in the memory array and each bit line coupled to an enabled column in the redundant memory array during a neural read operation.

28. The system of claim 26, further comprising:
for each bit line in the memory array, one or more switches between the latch and the memory array.

29. The system of claim 26, wherein each of the memory cells in the memory array and each of the memory cells in the redundant memory array is a split-gate flash memory cell.

30. The system of claim 26, wherein the memory array is a vector-by-matrix multiplication array in a long short term memory system.

31. The system of claim 26, wherein the memory array is a vector-by-matrix multiplication array in a gated recurrent unit system.

* * * * *